(12) United States Patent
Kim et al.

(10) Patent No.: US 11,495,531 B2
(45) Date of Patent: Nov. 8, 2022

(54) SEMICONDUCTOR DEVICE PACKAGE AND METHOD OF MANUFACTURING THE SAME

(71) Applicant: Advanced Semiconductor Engineering Korea, Inc., Gyeonggi-Do (KR)

(72) Inventors: Seokbong Kim, Gyeonggi-Do (KR); Eunshim Lee, Gyeonggi-Do (KR)

(73) Assignee: ADVANCED SEMICONDUCTORE ENGINEERING KOREA, INC., Paju-si (KR)

( * ) Notice: Subject to any disclaimer, the term of this patent is extended or adjusted under 35 U.S.C. 154(b) by 0 days.

(21) Appl. No.: 16/925,254

(22) Filed: Jul. 9, 2020

(65) Prior Publication Data

US 2022/0013452 A1    Jan. 13, 2022

(51) Int. Cl.
H01L 23/48 (2006.01)
H01L 23/522 (2006.01)
(Continued)

(52) U.S. Cl.
CPC ........ H01L 23/5226 (2013.01); H01L 21/565 (2013.01); H01L 21/76897 (2013.01); H01L 21/76898 (2013.01); H01L 23/3128 (2013.01); H01L 23/3135 (2013.01); H01L 23/481 (2013.01); H01L 23/5283 (2013.01);
(Continued)

(58) Field of Classification Search
CPC ......... H01L 23/00; H01L 23/31; H01L 23/48; H01L 23/481; H01L 23/522; H01L 23/528; H01L 23/5226; H01L 23/3128; H01L 23/5283; H01L 23/5283; H01L 23/498; H01L 23/538; H01L 23/49894; H01L 23/5389; H01L 23/49827; H01L 23/5384; H01L 23/28; H01L 23/3192; H01L 23/3142; H01L 23/3157; H01L 21/4846; H01L 21/4867; H01L 21/4807; H01L 21/481; H01L 21/56; H01L 21/568; H01L 2924/181; H01L 2924/186; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235; H01L 23/49811; H01L 2225/06548; H01L 23/3135; H01L 25/16; H01L 24/08; H01L 24/16; H01L 24/32; H01L 24/48;
(Continued)

(56) References Cited

U.S. PATENT DOCUMENTS 6,614,104 B2 *  9/2003  Farnworth ............. H01L 24/06
                                                         257/686
7,863,755 B2   1/2011  Lee et al.
(Continued)

Primary Examiner — Chuong A Luu
(74) Attorney, Agent, or Firm — Foley & Lardner LLP

(57) ABSTRACT

A semiconductor device package and a method for manufacturing the semiconductor device package are provided. The semiconductor device package includes a carrier, an electronic component, a first encapsulant and a conductive via. The carrier has a first surface and a second surface opposite to the first surface. The semiconductor device is mounted at the second surface of the carrier. The first encapsulant encapsulates the first surface of the carrier and has a surface facing away from the first surface of the carrier. The conductive via extends from the surface of the first encapsulant into the carrier.

19 Claims, 15 Drawing Sheets

(51) Int. Cl.
   *H01L 23/00*     (2006.01)
   *H01L 23/31*     (2006.01)
   *H01L 23/528*    (2006.01)
   *H01L 21/56*     (2006.01)
   *H01L 21/768*    (2006.01)
   *H01L 25/16*     (2006.01)

(52) U.S. Cl.
   CPC .............. *H01L 24/08* (2013.01); *H01L 24/16* (2013.01); *H01L 24/32* (2013.01); *H01L 24/48* (2013.01); *H01L 24/73* (2013.01); *H01L 25/16* (2013.01); *H01L 2224/02379* (2013.01)

(58) Field of Classification Search
   CPC ..... H01L 24/73; H01L 21/565; H01L 21/768; H01L 21/76897; H01L 21/76898
   USPC ........................................................ 257/774
   See application file for complete search history.

(56) References Cited

U.S. PATENT DOCUMENTS

2016/0013146 A1*  1/2016  Chen ................. H01L 24/20
                                                    257/738
   2016/0086930 A1   3/2016  Koey et al.
   2017/0179078 A1*  6/2017  Jung ................ H01L 25/0652
   2021/0280522 A1*  9/2021  Liu .................. H01L 24/20

* cited by examiner

SEMICONDUCTOR DEVICE PACKAGE AND METHOD OF MANUFACTURING THE SAME

BACKGROUND

1. Field of the Disclosure

The instant disclosure relates to, amongst other things, a semiconductor device package and method of manufacturing the same.

2. Description of Related Art

Due to demand for high performance and high density semiconductor device packages, a semiconductor package is designed to have high density input and output (I/O) counts. However, the I/O counts of a semiconductor package including a double-side molding structure cannot be easily increased due to dies or components located at the bottom side of the semiconductor package.

SUMMARY

According to one example embodiment of the instant disclosure, a semiconductor device package includes a carrier, an electronic component, a first encapsulant and a conductive via. The carrier has a first surface and a second surface opposite to the first surface. The electronic component is mounted at the second surface of the carrier. The first encapsulant encapsulates the first surface of the carrier and has a surface facing away from the first surface of the carrier. The conductive via extends from the surface of the first encapsulant to the carrier, and a portion of the conductive via extends into the carrier.

According to another example embodiment of the instant disclosure, a semiconductor device package includes a carrier, an electronic component, a first encapsulant and a conductive via. The carrier has a first surface and a second surface opposite to the first surface. The electronic component is mounted at the second surface of the carrier. The first encapsulant encapsulates the first surface of the carrier and has a surface facing away from the first surface of the carrier. The conductive via extends from the surface of the first encapsulant to the carrier and has an end surface coplanar with the surface of the first encapsulant.

According to another example embodiment of the instant disclosure, method of manufacturing a semiconductor device package includes: providing a carrier with a first surface and a second surface opposite to the first surface; forming a first encapsulant to encapsulate the first surface of the carrier, wherein the first encapsulant has a surface facing away from the first surface of the carrier; forming a through hole extending from the surface of the first encapsulant to the carrier; forming a conductive via in the through hole; and mounting an electronic component on the second surface of the carrier.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
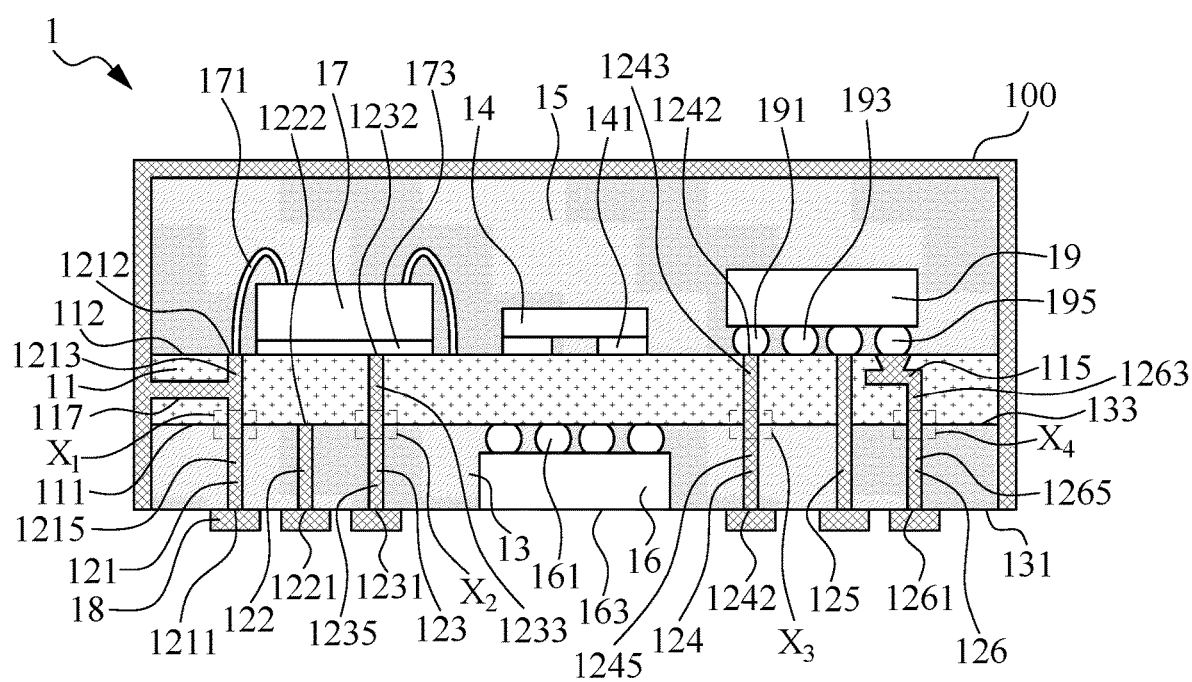
FIG. 1A is a cross-sectional view of a semiconductor device package in accordance with an embodiment of the instant disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosure provides a semiconductor device package including a double-side molding structure. The semiconductor device package has a number of the conductive vias formed by mechanical drilling. Since the conductive vias are formed by mechanical drilling, the length and the size of the conductive via could be controlled. Especially, the width of the conductive via could be reduced. Thus, the I/O counts of the semiconductor device package could be increased.

FIG. 1A is a cross-sectional view of a semiconductor device package 1 in accordance with some embodiments of the present disclosure. As shown in FIG. 1A, the semiconductor device package 1 includes a carrier 11, electronic components 14, 16, 17 and 19, encapsulants 13, 15 and conductive vias 121, 122, 123, 124, 125, 126. In some embodiments of the present disclosure, the carrier 11 includes a substrate. In some embodiments of the present disclosure, the carrier 11 includes a fan-out circuit layer. In some embodiments of the present disclosure, the carrier 11 includes interconnection structures 115, 117. The interconnection structure 115, 117 may include traces, pads or interconnections for electrical connection. Referring to FIG. 1A, the carrier 11 has a surface 111 (e.g., a lower surface), and the electronic component 16 is disposed or mounted on the surface 111 of the carrier 11. The electronic component 16 may be a die, an active device, a passive device, and/or other electronic devices. In some embodiments of the present disclosure, the electronic component 16 may electrically connected to the carrier 11 via electrical connections 161. The electrical connection 161 may include a solder ball or a solder bump such as a C4 bump. The encapsulant 13 (i.e., package body) covers or encapsulates the surface 111 of carrier 11 and the electronic component 16. The encapsulant 13 may include molding compounds, such as a Novolac-based resin, an epoxy-based resin, a silicone-based resin, or other another suitable encapsulant; fillers such as silicon oxide fillers, may be included in the molding compound. In addition, the encapsulant 13 may include a molding underfill (MUF) or a capillary underfill (CUF). The encapsulant 13 includes a surface 131 facing away from the surface 111 of the carrier 11 and a surface 133 facing the surface 111 of the carrier 11. In some embodiments of the present disclosure, the electronic component 16 has a surface 163 which may be coplanar with the surface 131 of the encapsulant 13.

Further, referring to FIG. 1A, the carrier 11 has a surface 112 (e.g., an upper surface), and the electronic components 14, 17, 19 are disposed or mounted on the surface 112 of the carrier 11. The electronic components 14, 17, 19 may be a die, an active device, a passive device, and/or other electronic devices. In some embodiments of the present disclosure, the electronic component 14 may electrically connected to the carrier 11 via conductive pads 141. In some embodiments of the present disclosure, the electronic component 17 may electrically connected to the carrier 11 via bonding wires 171 and adhesive layer 173. The adhesive layer 173 may include adhesion material, such as DAF. In some embodiments of the present disclosure, the electronic component 19 may electrically connected to the carrier 11 via electrical connections 191, 193, 195. The electrical connection 191, 193 or 195 may include a solder ball or a solder bump such as a C4 bump. The encapsulant 15 (i.e., package body) covers or encapsulates the surface 112 of carrier 11 and the electronic components 16, 17, 19. The encapsulant 15 may include molding compounds, such as a Novolac-based resin, an epoxy-based resin, a silicone-based resin, or other another suitable encapsulant; fillers such as silicon oxide fillers, may be included in the molding compound. In addition, the encapsulant 15 may include a molding underfill (MUF) or a capillary underfill (CUF).

As shown in FIG. 1A, the semiconductor device package 1 includes a number of the conductive vias 121, 122, 123, 124, 125, 126 extending from the surface 131 of the encapsulant 13, which faces away from the surface 111 of the carrier 11.

Referring to FIG. 1A, the conductive via 121 extends from the surface 131 of the encapsulant 13 to the surface 112 of the carrier 11. That is, the conductive via 121 extends throughout the encapsulant 13 and the carrier 11. The conductive via 121 may include an end surface 1211 coplanar with the surface 131 of the encapsulant 13. In some embodiments of the present disclosure, the end surface 1211 of the conductive via 121 connects to a pad 18. Further, the conductive via 121 may include an end surface 1212 opposite to the end surface 1211. In some embodiments of the present disclosure, the end surface 1212 of the conductive via 121 directly contacts the bonding wire 171, and thus the conductive via 121 electrically connect to the electronic component 17. In some embodiments of the present disclosure, the conductive via 121 is a thermal via which serves as a shorter thermal path to the outside of the semiconductor device package 1. In some embodiments of the present disclosure, the conductive via 121 is a signal via which serves as a shorter signal path for transferring the normal signal or the high speed signal. In some embodiments of the present disclosure, the conductive via 121 is a grounding via which serves as a grounding path. In some embodiments of the present disclosure, the conductive via 121 serves as a power path.

Further, since the conductive via 121 extends throughout the encapsulant 13 and the carrier 11, the conductive via 121 may include a first portion 1213 extending within the carrier 11 and a second portion 1215 extending within the encapsulant 13. In some embodiments of the present disclosure, a diameter of the first portion 1213 is substantially equal to a diameter of the second portion 1215.

Referring to FIG. 1A, the conductive via 122 extends from the surface 131 of the encapsulant 13 to the surface 111 of the carrier 11. That is, the conductive via 122 extends throughout the encapsulant 13 only. The conductive via 122 may include an end surface 1221 coplanar with the surface 131 of the encapsulant 13. In some embodiments of the present disclosure, the end surface 1221 of the conductive via 122 connects to a pad 18. Further, the conductive via 122 may include an end surface 1222 opposite to the end surface 1221. The end surface 1222 of the conductive via 122 may contact the surface 111 of the carrier 11. In some embodiments of the present disclosure, the end surface 1222 of the conductive via 122 contacts the interconnection structure of the carrier, such as the pads or the trace. As shown in FIG. 1A, the conductive via 122 is arranged underneath the electronic component 17. Thus, the electronic component 17 overlaps the conductive via 122 from a top view perspective. In some embodiments of the present disclosure, the conductive via 122 is a thermal via which serves as a shorter thermal path to the outside of the semiconductor device package 1. In some embodiments of the present disclosure, the conductive via 122 is a signal via which serves as a shorter signal path for transferring the normal signal or the high speed signal. In some embodiments of the present disclosure, the conductive via 122 is a grounding via which serves as a grounding path. In some embodiments of the present disclosure, the conductive via 122 serves as a power path.

Referring to FIG. 1A, the conductive via 123 extends from the surface 131 of the encapsulant 13 to the surface 112 of the carrier 11. That is, the conductive via 123 extends throughout the encapsulant 13 and the carrier 11. The conductive via 123 may include an end surface 1231 coplanar with the surface 131 of the encapsulant 13. In some embodiments of the present disclosure, the end surface 1231 of the conductive via 123 connects to a pad 18. Further, the conductive via 123 may include an end surface 1232 opposite to the end surface 1231. In some embodiments of the present disclosure, the end surface 1232 of the conductive via 123 directly contacts the adhesive layer 173, and thus the conductive via 123 electrically connects to the electronic component 17. As shown in FIG. 1A, the conductive via 123 is arranged underneath the electronic component 17. Thus, the electronic component 17 overlaps the conductive via 123 from a top view perspective. In some embodiments of the present disclosure, the conductive via 123 is a thermal via which serves as a shorter thermal path to the outside of the semiconductor device package 1. In some embodiments of the present disclosure, the conductive via 123 is a signal via which serves as a shorter signal path for transferring the normal signal or the high speed signal. In some embodiments of the present disclosure, the conductive via 123 is a grounding via which serves as a grounding path. In some embodiments of the present disclosure, the conductive via 123 serves as a power path.

Further, since the conductive via 123 extends throughout the encapsulant 13 and the carrier 11, the conductive via 123 may include a first portion 1233 extending within the carrier 11 and a second portion 1235 extending within the encapsulant 13. In some embodiments of the present disclosure, a diameter of the first portion 1233 is substantially equal to a diameter of the second portion 1235.

Referring to FIG. 1A, the conductive via 124 extends from the surface 131 of the encapsulant 13 to the surface 112 of the carrier 11. That is, the conductive via 124 extends throughout the encapsulant 13 and the carrier 11. The conductive via 124 may include an end surface 1241 coplanar with the surface 131 of the encapsulant 13. In some embodiments of the present disclosure, the end surface 1241 of the conductive via 124 connects to a pad 18. Further, the conductive via 124 may include an end surface 1242 opposite to the end surface 1241. In some embodiments of the present disclosure, the end surface 1242 of the conductive via 124 directly contacts the electrical connection 191, and thus the conductive via 124 electrically connects to the electronic component 19. As shown in FIG. 1A, the conductive via 124 is arranged underneath the electronic component 19. Thus, the electronic component 19 overlaps the conductive via 124 from a top view perspective. In some embodiments of the present disclosure, the conductive via 124 is a thermal via which serves as a shorter thermal path to the outside of the semiconductor device package 1. In some embodiments of the present disclosure, the conductive via 124 is a signal via which serves as a shorter signal path for transferring the normal signal or the high speed signal. In some embodiments of the present disclosure, the conductive via 124 is a grounding via which serves as a grounding path. In some embodiments of the present disclosure, the conductive via 124 serves as a power path.

Further, since the conductive via 124 extends throughout the encapsulant 13 and the carrier 11, the conductive via 124 may include a first portion 1243 extending within the carrier 11 and a second portion 1245 extending within the encapsulant 13. In some embodiments of the present disclosure, a diameter of the first portion 1243 is substantially equal to a diameter of the second portion 1245.

Referring to FIG. 1A, the conductive via 125 extends from the surface 131 of the encapsulant 13 to the surface 112 of the carrier 11. In some embodiments of the present disclosure, the conductive via 125 is the same as, or similar to, the conductive via 124.

Referring to FIG. 1A, the conductive via 126 extends from the surface 131 of the encapsulant 13 and extends into the carrier 11. Thus, the conductive via 126 extends throughout the encapsulant 13 and a portion of the conductive via 126 embedded in the carrier 1. The conductive via 126 may include an end surface 1261 coplanar with the surface 131 of the encapsulant 13. In some embodiments of the present disclosure, the end surface 1261 of the conductive via 126 connects to a pad 18. As shown in FIG. 1A, the portion of the conductive via 126 extending into the carrier 11 connects to the interconnection structure 115 of the carrier 11 and the interconnection structure 115 further connects to the electrical connection 195, and thus the conductive via 126 electrically connects to the electronic component 19 via the interconnection structure 115. In some embodiments of the present disclosure, the conductive via 126 is a thermal via which serves as a shorter thermal path to the outside of the semiconductor device package 1. In some embodiments of the present disclosure, the conductive via 126 is a signal via which serves as a shorter signal path for transferring the normal signal or the high speed signal. In some embodiments of the present disclosure, the conductive via 126 is a grounding via which serves as a grounding path. In some embodiments of the present disclosure, the conductive via 126 serves as a power path.

Further, since the conductive via 126 extends throughout the encapsulant 13 and a portion of the conductive via 126 embedded in the carrier 1, the conductive via 126 may include a first portion 1263 extending within the carrier 11 and a second portion 1265 extending within the encapsulant 13. In some embodiments of the present disclosure, a diameter of the first portion 1263 is substantially equal to a diameter of the second portion 1265.

In addition, as shown in FIG. 1A, the electrical connection 193 directly contacts the carrier 11. Thus, the electronic component 19 may include the electrical connections 191 directly contacting the conductive vias 124, 125 and the electrical connections 193, 195 directly contacting the carrier 11.

In some embodiments of the present disclosure, a conductive layer 100 is formed on the side surfaces of the carrier 11, the side surfaces of the encapsulant 13 and the side surfaces and the upper surface of the encapsulant 15. The conductive layer 100 may be a shielding layer which electrically connects to the conductive via 121 via the interconnection structure 117.

Figure 1B:
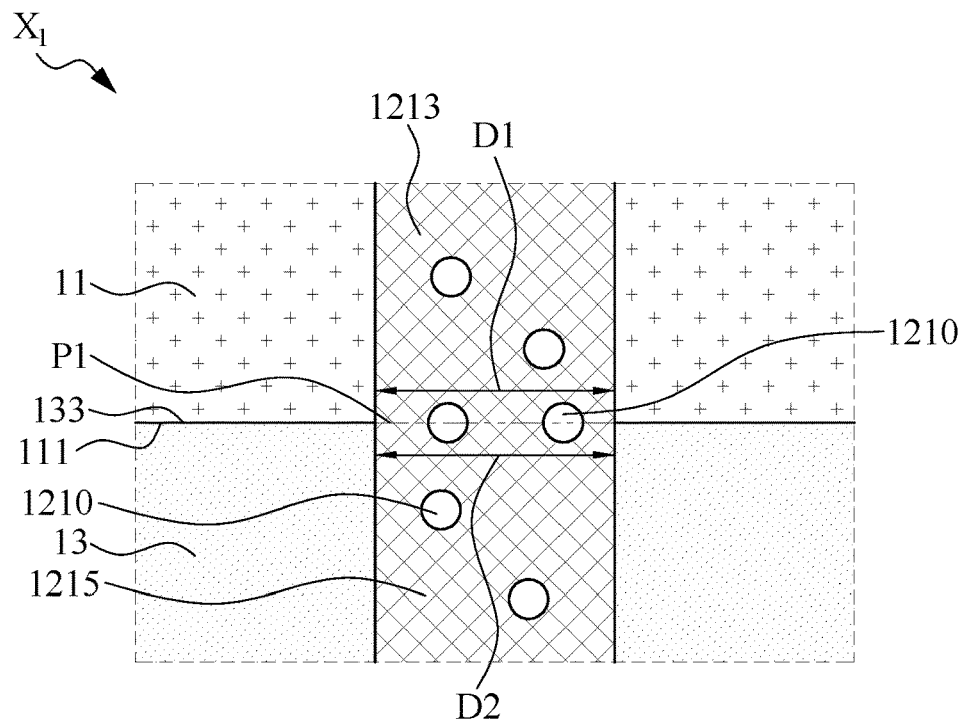
FIG. 1B is an enlarged view of portion "X1" illustrated in FIG. 1A.

FIG. 1B is an enlarged view of portion "X1" illustrated in FIG. 1A. Referring to FIG. 1B, the first portion 1213 of the conductive via 121 has a diameter D1 adjacent to the surface 111 of the carrier 11 and the second portion 1215 of the conductive via 121 has a diameter D2 adjacent to the surface 133 of the encapsulant 13. In some embodiments of the present disclosure, the diameter D1 is substantially equal to the diameter D2.

Further, the conductive via 121 includes a plurality of conductive particles 1210. In some embodiments of the present disclosure, the conductive particles 1210 cross a boundary plane P1 between the carrier 11 and the encapsulant 13.

Figure 1C:
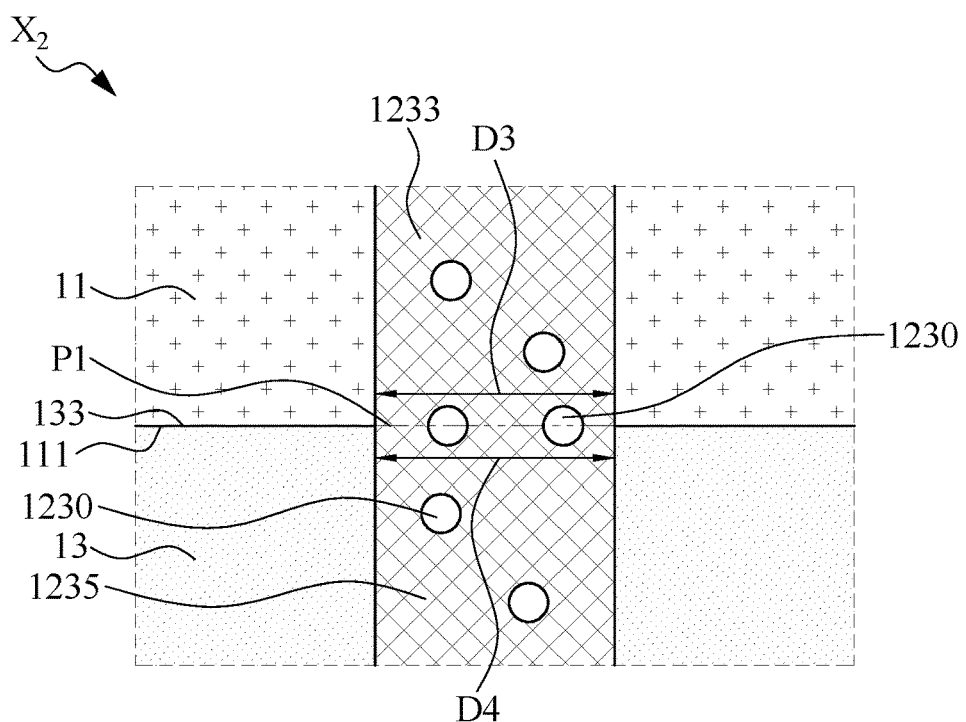
FIG. 1C is an enlarged view of portion "X2" illustrated in FIG. 1A.

FIG. 1C is an enlarged view of portion "X2" illustrated in FIG. 1A. Referring to FIG. 1C, the first portion 1233 of the conductive via 121 has a diameter D3 adjacent to the surface 111 of the carrier 11 and the second portion 1235 of the conductive via 123 has a diameter D4 adjacent to the surface 133 of the encapsulant 13. In some embodiments of the present disclosure, the diameter D3 is substantially equal to the diameter D4.

Further, the conductive via 123 includes a plurality of conductive particles 1230. In some embodiments of the present disclosure, the conductive particles 1230 cross a boundary plane P1 between the carrier 11 and the encapsulant 13.

Figure 1D:
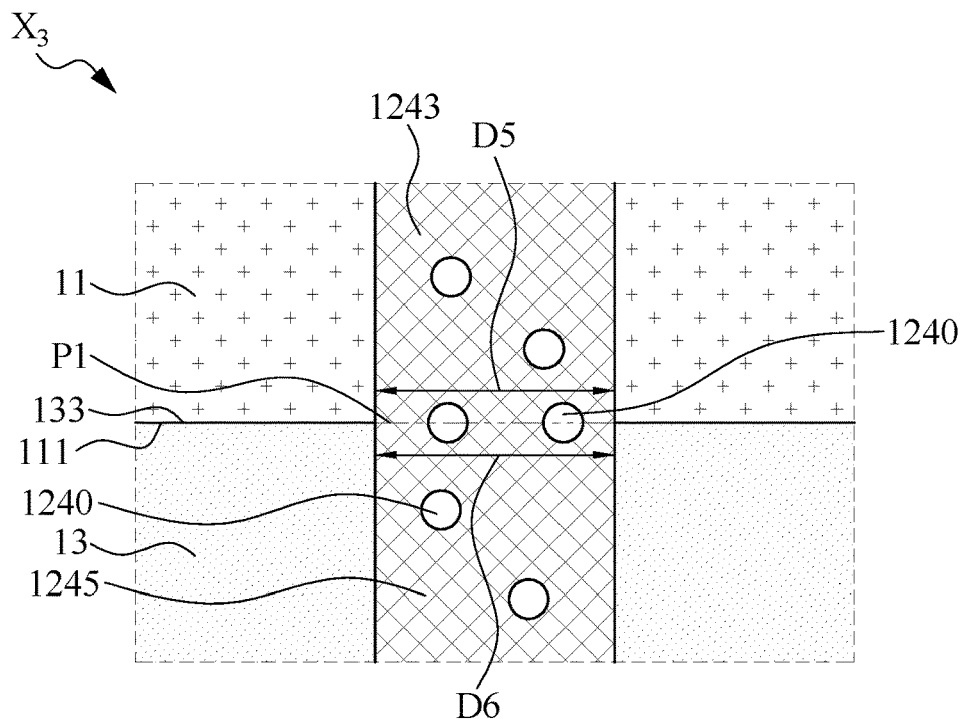
FIG. 1D is an enlarged view of portion "X3" illustrated in FIG. 1A.

FIG. 1D is an enlarged view of portion "X3" illustrated in FIG. 1A. Referring to FIG. 1D, the first portion 1243 of the conductive via 124 has a diameter D5 adjacent to the surface 111 of the carrier 11 and the second portion 1245 of the conductive via 124 has a diameter D6 adjacent to the surface 133 of the encapsulant 13. In some embodiments of the present disclosure, the diameter D5 is substantially equal to the diameter D6.

Further, the conductive via 124 includes a plurality of conductive particles 1240. In some embodiments of the present disclosure, the conductive particles 1240 cross a boundary plane P1 between the carrier 11 and the encapsulant 13.

Figure 1E:
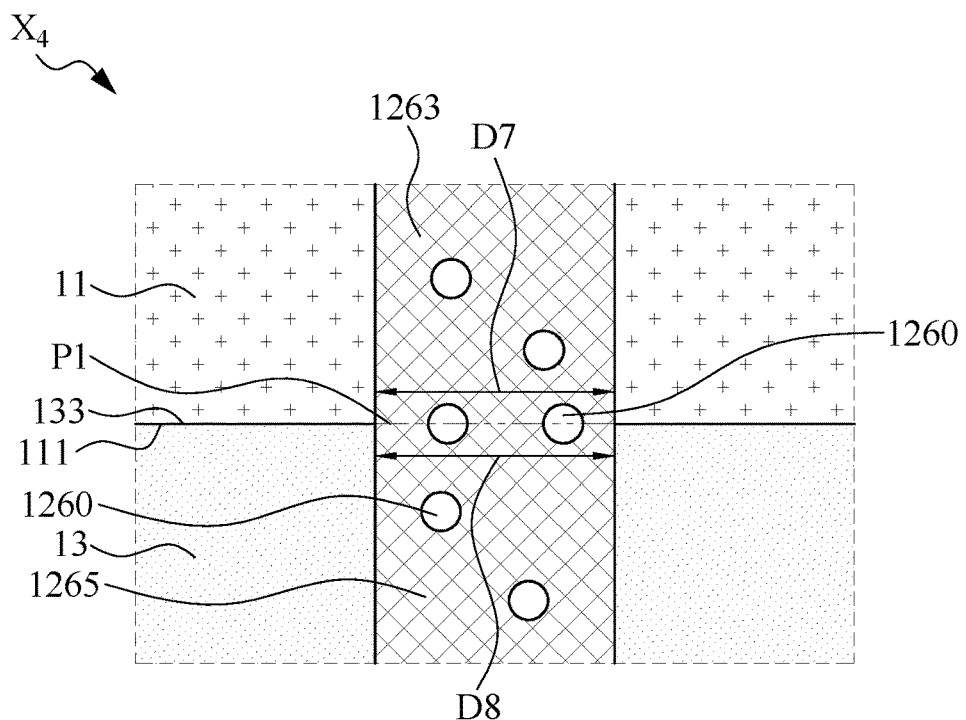
FIG. 1E is an enlarged view of portion "X4" illustrated in FIG. 1A.

FIG. 1E is an enlarged view of portion "X4" illustrated in FIG. 1A. Referring to FIG. 1E, the first portion 1263 of the conductive via 126 has a diameter D7 adjacent to the surface 111 of the carrier 11 and the second portion 1265 of the conductive via 126 has a diameter D8 adjacent to the surface 133 of the encapsulant 13. In some embodiments of the present disclosure, the diameter D7 is substantially equal to the diameter D8.

Further, the conductive via 126 includes a plurality of conductive particles 1260. In some embodiments of the present disclosure, the conductive particles 1260 cross a boundary plane P1 between the carrier 11 and the encapsulant 13.

Figure 2A:
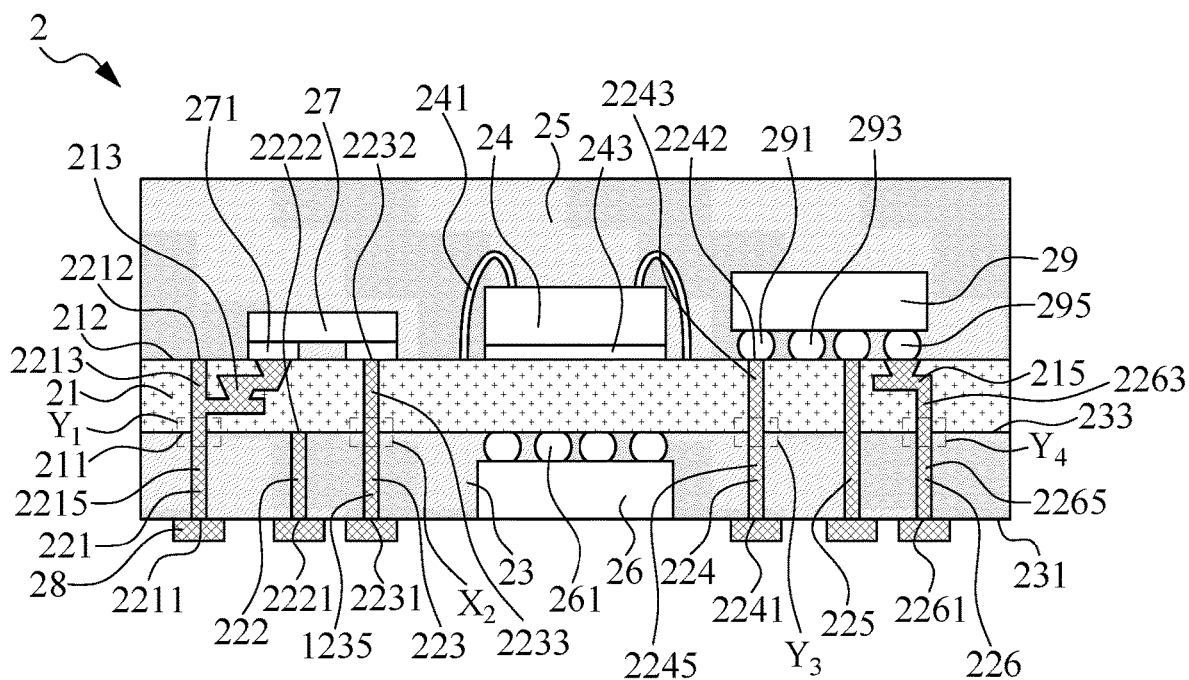
FIG. 2A is a cross-sectional view of a semiconductor device package in accordance with an embodiment of the instant disclosure.

FIG. 2A is a cross-sectional view of a semiconductor device package 2 in accordance with some embodiments of the present disclosure. As shown in FIG. 2A, the semiconductor device package 2 includes a carrier 21, electronic components 24, 26, 27 and 29, encapsulants 23, 25 and conductive vias 221, 222, 223, 224, 225, 226. In some embodiments of the present disclosure, the carrier 21 includes a substrate. In some embodiments of the present disclosure, the carrier 21 includes a fan-out circuit layer. In some embodiments of the present disclosure, the carrier 21 includes interconnection structures 213, 215. The interconnection structure 213, 215 may include traces, pads or interconnections for electrical connection. Referring to FIG. 2A, the carrier 21 has a surface 211 (e.g., a lower surface), and the electronic component 26 is disposed or mounted on the surface 211 of the carrier 21. The electronic component 26 may be a die, an active device, a passive device, and/or other electronic devices. In some embodiments of the present disclosure, the electronic component 26 may electrically connected to the carrier 21 via electrical connections 261. The electrical connection 261 may include a solder ball or a solder bump such as a C4 bump. The encapsulant 23 (i.e., package body) covers or encapsulates the surface 211 of carrier 21 and the electronic component 26. The encapsulant 23 may include molding compounds, such as a Novolac-based resin, an epoxy-based resin, a silicone-based resin, or other another suitable encapsulant; fillers such as silicon oxide fillers, may be included in the molding compound. In addition, the encapsulant 23 may include a molding underfill (MUF) or a capillary underfill (CUF). The encapsulant 23 includes a surface 231 facing away from the surface 211 of the carrier 21 and a surface 233 facing the surface 211 of the carrier 21.

Further, referring to FIG. 2A, the carrier 11 has a surface 212 (e.g., an upper surface), and the electronic components 24, 27, 29 are disposed or mounted on the surface 212 of the carrier 21. The electronic components 24, 27, 29 may be a die, an active device, a passive device, and/or other electronic devices. In some embodiments of the present disclosure, the electronic component 24 may electrically connected to the carrier 21 via bonding wires 241 and adhesive layer 243. The adhesive layer 243 may include adhesion material, such as DAF. In some embodiments of the present disclosure, the electronic component 27 may electrically connected to the carrier 21 via conductive pads 271. In some embodiments of the present disclosure, the electronic component 29 may electrically connected to the carrier 21 via electrical connections 291, 293, 295. The electrical connection 291, 293 or 295 may include a solder ball or a solder bump such as a C4 bump. The encapsulant 25 (i.e., package body) covers or encapsulates the surface 212 of carrier 21 and the electronic components 24, 27, 29. The encapsulant 25 may include molding compounds, such as a Novolac-based resin, an epoxy-based resin, a silicone-based resin, or other another suitable encapsulant; fillers such as silicon oxide fillers, may be included in the molding compound. In addition, the encapsulant 25 may include a molding underfill (MUF) or a capillary underfill (CUF).

As shown in FIG. 2A, the semiconductor device package 2 includes a number of the conductive vias 221, 222, 223, 224, 225, 226 extending from a surface 231 of the encapsulant 23, which faces away from the surface 211 of the carrier 21.

Referring to FIG. 2A, the conductive via 221 extends from the surface 231 of the encapsulant 23 to the surface 212 of the carrier 21. That is, the conductive via 221 extends throughout the encapsulant 23 and the carrier 21. The conductive via 221 may include an end surface 2211 coplanar with the surface 231 of the encapsulant 23. In some embodiments of the present disclosure, the end surface 2211 of the conductive via 221 connects to a pad 28. Further, the conductive via 221 may include an end surface 2212 opposite to the end surface 2211. The end surface 2212 of the conductive via 221 may directly contact the encapsulant 23. In some embodiments of the present disclosure, the conductive via 121 connects to the interconnection structure 213 and the interconnection structure 213 further connects to the conductive pad 271, and thus the conductive via 221 electrically connect to the electronic component 27 via the interconnection structure 213. In some embodiments of the present disclosure, the conductive via 221 is a thermal via which serves as a shorter thermal path to the outside of the semiconductor device package 2. In some embodiments of the present disclosure, the conductive via 221 is a signal via which serves as a shorter signal path for transferring the normal signal or the high speed signal. In some embodiments of the present disclosure, the conductive via 221 is a grounding via which serves as a grounding path. In some embodiments of the present disclosure, the conductive via 221 serves as a power path.

Further, since the conductive via 221 extends throughout the encapsulant 23 and the carrier 21, the conductive via 221 may include a first portion 2213 extending within the carrier 21 and a second portion 2215 extending within the encapsulant 23. In some embodiments of the present disclosure, a diameter of the first portion 2213 is substantially equal to a diameter of the second portion 2215.

Referring to FIG. 2A, the conductive via 222 extends from the surface 231 of the encapsulant 23 to the surface 211 of the carrier 21. That is, the conductive via 221 extends throughout the encapsulant 23 only. The conductive via 222 may include an end surface 2221 coplanar with the surface 231 of the encapsulant 23. In some embodiments of the present disclosure, the end surface 2221 of the conductive via 222 connects to a pad 28. Further, the conductive via 222 may include an end surface 2222 opposite to the end surface 2221. The end surface 2222 of the conductive via 222 may contact the surface 211 of the carrier 21. In some embodiments of the present disclosure, the end surface 2222 of the conductive via 222 contacts the interconnection structure of the carrier, such as the pads or the trace. As shown in FIG. 2A, the conductive via 222 is arranged underneath the electronic component 27. Thus, the electronic component 27 overlaps the conductive via 222 from a top view perspective. In some embodiments of the present disclosure, the conductive via 222 is a thermal via which serves as a shorter thermal path to the outside of the semiconductor device package 2. In some embodiments of the present disclosure, the conductive via 222 is a signal via which serves as a shorter signal path for transferring the normal signal or the high speed signal. In some embodiments of the present disclosure, the conductive via 222 is a grounding via which serves as a grounding path. In some embodiments of the present disclosure, the conductive via 222 serves as a power path.

Referring to FIG. 2A, the conductive via 223 extends from the surface 231 of the encapsulant 23 to the surface 212 of the carrier 21. That is, the conductive via 223 extends throughout the encapsulant 23 and the carrier 21. The conductive via 223 may include an end surface 2231 coplanar with the surface 231 of the encapsulant 23. In some embodiments of the present disclosure, the end surface 2231 of the conductive via 223 connects to a pad 28. Further, the conductive via 223 may include an end surface 2232 opposite to the end surface 2231. In some embodiments of the present disclosure, the end surface 2232 of the conductive via 223 directly contacts the conductive pad 271, and thus the conductive via 223 electrically connects to the electronic component 27. As shown in FIG. 2A, the conductive via 223 is arranged underneath the electronic component 27. Thus, the electronic component 27 overlaps the conductive via 223 from a top view perspective. In some embodiments of the present disclosure, the conductive via 223 is a thermal via which serves as a shorter thermal path to the outside of the semiconductor device package 2. In some embodiments of the present disclosure, the conductive via 223 is a signal via which serves as a shorter signal path for transferring the normal signal or the high speed signal. In some embodiments of the present disclosure, the conductive via 223 is a grounding via which serves as a grounding path. In some embodiments of the present disclosure, the conductive via 223 serves as a power path.

Further, since the conductive via 223 extends throughout the encapsulant 23 and the carrier 21, the conductive via 223 may include a first portion 2233 extending within the carrier 21 and a second portion 2235 extending within the encapsulant 23. In some embodiments of the present disclosure, a diameter of the first portion 2233 is substantially equal to a diameter of the second portion 2235.

Referring to FIG. 2A, the conductive via 224 extends from the surface 231 of the encapsulant 23 to the surface 212 of the carrier 21. That is, the conductive via 224 extends throughout the encapsulant 23 and the carrier 21. The conductive via 224 may include an end surface 2241 coplanar with the surface 231 of the encapsulant 23. In some embodiments of the present disclosure, the end surface 2241 of the conductive via 224 connects to a pad 28. Further, the conductive via 224 may include an end surface 2242 opposite to the end surface 2241. In some embodiments of the present disclosure, the end surface 2242 of the conductive via 224 directly contacts the electrical connection 291, and thus the conductive via 224 electrically connects to the electronic component 29. As shown in FIG. 2A, the conductive via 224 is arranged underneath the electronic component 29. Thus, the electronic component 29 overlaps the conductive via 224 from a top view perspective. In some embodiments of the present disclosure, the conductive via 224 is a thermal via which serves as a shorter thermal path to the outside of the semiconductor device package 2. In some embodiments of the present disclosure, the conductive via 224 is a signal via which serves as a shorter signal path for transferring the normal signal or the high speed signal. In some embodiments of the present disclosure, the conductive via 224 is a grounding via which serves as a grounding path. In some embodiments of the present disclosure, the conductive via 224 serves as a power path.

Further, since the conductive via 224 extends throughout the encapsulant 23 and the carrier 21, the conductive via 224 may include a first portion 2243 extending within the carrier 21 and a second portion 2245 extending within the encapsulant 23. In some embodiments of the present disclosure, a diameter of the first portion 2243 is substantially equal to a diameter of the second portion 2245.

Referring to FIG. 2A, the conductive via 225 extends from the surface 231 of the encapsulant 23 to the surface 212 of the carrier 21. In some embodiments of the present disclosure, the conductive via 225 is the same as, or similar to, the conductive via 224.

Referring to FIG. 2A, the conductive via 226 extends from the surface 231 of the encapsulant 23 and extends into the carrier 21. Thus, the conductive via 226 extends throughout the encapsulant 23 and a portion of the conductive via 226 embedded in the carrier 21. The conductive via 226 may include an end surface 2261 coplanar with the surface 231 of the encapsulant 23. In some embodiments of the present disclosure, the end surface 2261 of the conductive via 226 connects to a pad 28. As shown in FIG. 2A, the portion of the conductive via 226 extending into the carrier 21 connects to the interconnection structure 215 of the carrier 21 and the interconnection structure 215 further connects to the electrical connection 295, and thus the conductive via 226 electrically connects to the electronic component 29 via the interconnection structure 215. In some embodiments of the present disclosure, the conductive via 226 is a thermal via which serves as a shorter thermal path to the outside of the semiconductor device package 2. In some embodiments of the present disclosure, the conductive via 226 is a signal via which serves as a shorter signal path for transferring the normal signal or the high speed signal. In some embodiments of the present disclosure, the conductive via 226 is a grounding via which serves as a grounding path. In some embodiments of the present disclosure, the conductive via 226 serves as a power path.

Further, since the conductive via 226 extends throughout the encapsulant 23 and a portion of the conductive via 226 embedded in the carrier 21, the conductive via 226 may include a first portion 2263 extending within the carrier 21 and a second portion 2265 extending within the encapsulant 23. In some embodiments of the present disclosure, a diameter of the first portion 2263 is substantially equal to a diameter of the second portion 2265.

In addition, as shown in FIG. 2A, the electrical connection 293 directly contacts the carrier 21. Thus, the electronic component 29 may include the electrical connections 291 directly contacting the conductive vias 224, 225 and the electrical connections 293, 295 directly contacting the carrier 21.

Figure 2B:
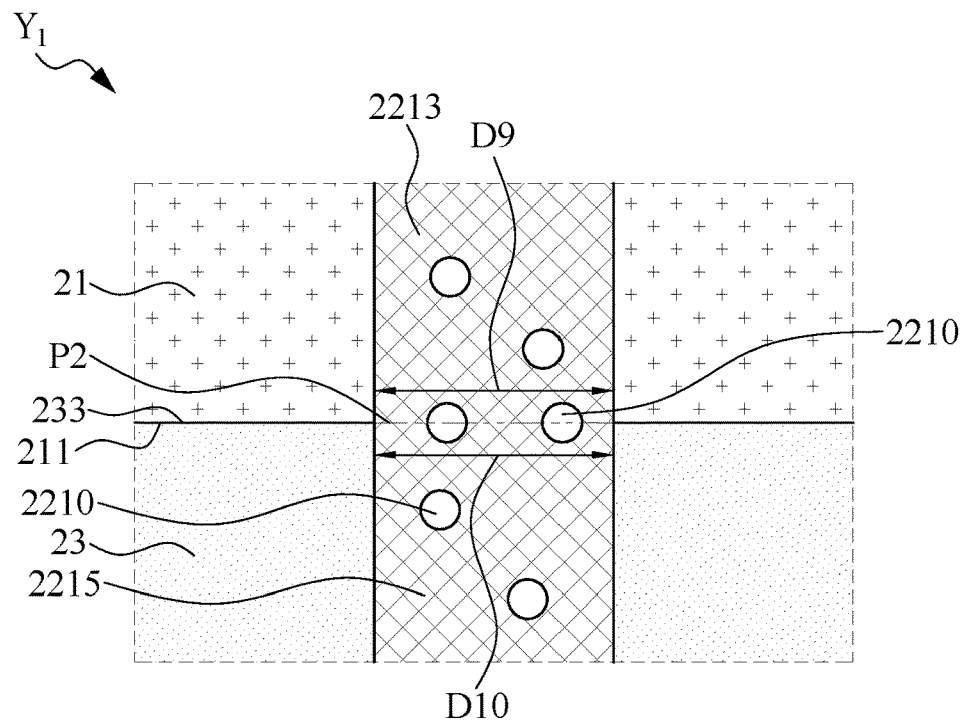
FIG. 2B is an enlarged view of portion "Y1" illustrated in FIG. 2A.

FIG. 2B is an enlarged view of portion "Y1" illustrated in FIG. 2A. Referring to FIG. 2B, the first portion 2213 of the conductive via 221 has a diameter D9 adjacent to the surface 211 of the carrier 21 and the second portion 2215 of the conductive via 221 has a diameter D10 adjacent to the surface 233 of the encapsulant 23. In some embodiments of the present disclosure, the diameter D9 is substantially equal to the diameter D10.

Further, the conductive via 221 includes a plurality of conductive particles 2210. In some embodiments of the present disclosure, the conductive particles 2210 cross a boundary plane P2 between the carrier 21 and the encapsulant 23.

Figure 2C:
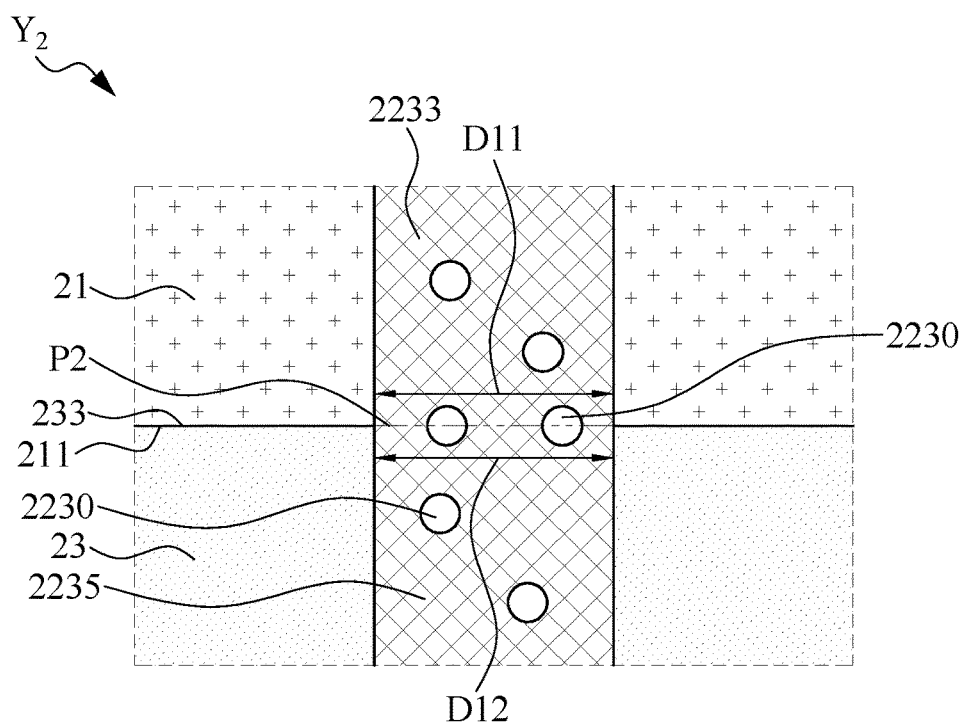
FIG. 2C is an enlarged view of portion "Y2" illustrated in FIG. 2A.

FIG. 2C is an enlarged view of portion "Y2" illustrated in FIG. 2A. Referring to FIG. 2C, the first portion 2233 of the conductive via 221 has a diameter D11 adjacent to the surface 211 of the carrier 21 and the second portion 2235 of the conductive via 223 has a diameter D12 adjacent to the surface 233 of the encapsulant 23. In some embodiments of the present disclosure, the diameter D11 is substantially equal to the diameter D12.

Further, the conductive via 223 includes a plurality of conductive particles 2230. In some embodiments of the present disclosure, the conductive particles 2230 cross a boundary plane P2 between the carrier 21 and the encapsulant 23.

Figure 2D:
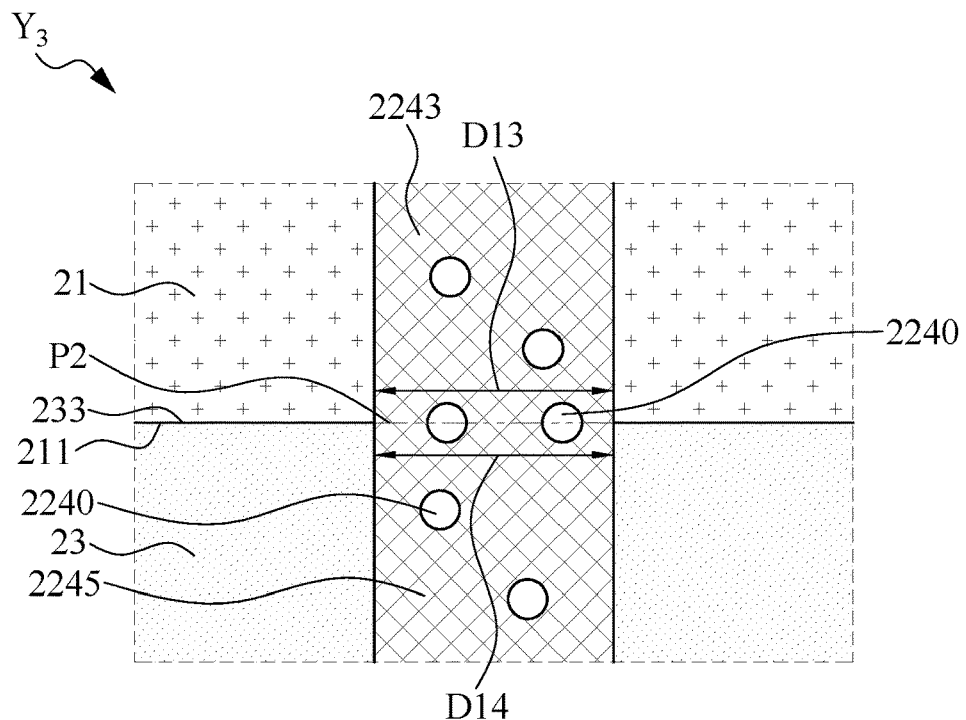
FIG. 2D is an enlarged view of portion "Y3" illustrated in FIG. 2A.

FIG. 2D is an enlarged view of portion "Y3" illustrated in FIG. 2A. Referring to FIG. 2D, the first portion 2243 of the conductive via 224 has a diameter D13 adjacent to the surface 211 of the carrier 21 and the second portion 2245 of the conductive via 224 has a diameter D14 adjacent to the surface 233 of the encapsulant 23. In some embodiments of the present disclosure, the diameter D13 is substantially equal to the diameter D14.

Further, the conductive via 224 includes a plurality of conductive particles 2240. In some embodiments of the present disclosure, the conductive particles 2240 cross a boundary plane P2 between the carrier 21 and the encapsulant 23.

Figure 2E:
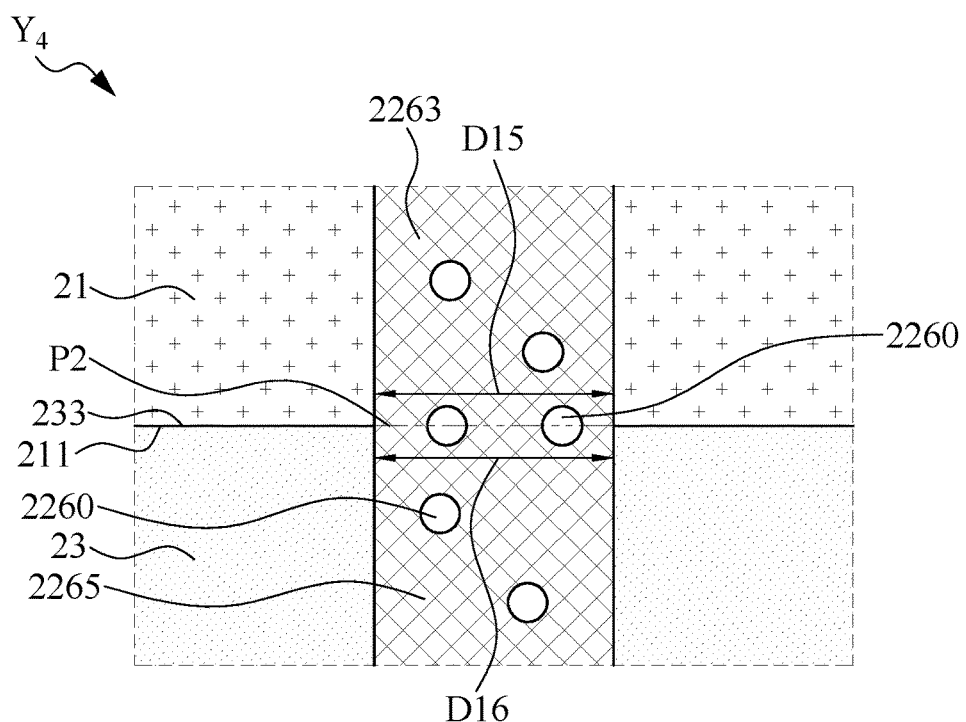
FIG. 2E is an enlarged view of portion "Y4" illustrated in FIG. 2A.

FIG. 2E is an enlarged view of portion "Y4" illustrated in FIG. 2A. Referring to FIG. 2E, the first portion 2263 of the conductive via 226 has a diameter D15 adjacent to the surface 211 of the carrier 21 and the second portion 2265 of the conductive via 226 has a diameter D16 adjacent to the surface 233 of the encapsulant 23. In some embodiments of the present disclosure, the diameter D15 is substantially equal to the diameter D16.

Further, the conductive via 226 includes a plurality of conductive particles 2260. In some embodiments of the present disclosure, the conductive particles 2260 cross a boundary plane P2 between the carrier 21 and the encapsulant 23.

FIG. 3A, FIG. 3B, FIG. 3C, FIG. 3D, FIG. 3E, FIG. 3F, FIG. 3G and FIG. 3H illustrate a method for manufacturing a semiconductor device package 3 in accordance with some embodiments of the present disclosure.

Figure 3A:
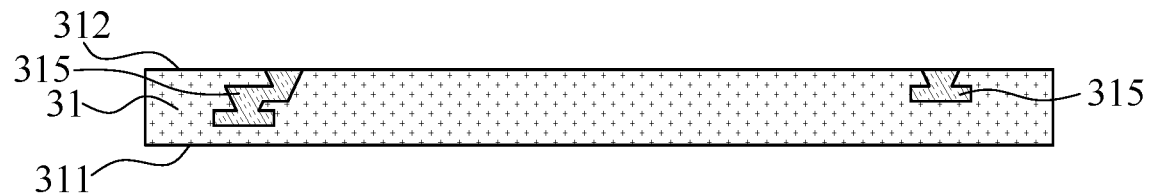
FIG. 3A, FIG. 3B, FIG. 3C, FIG. 3D, FIG. 3E, FIG. 3F, FIG. 3G and FIG. 3H, illustrate a method of manufacturing a semiconductor device package in accordance with another embodiment of the instant disclosure.

Referring to FIG. 3A, a carrier 31 may include a substrates. In some embodiments of the present disclosure, the carrier 31 includes interconnection structures 315, such as traces, pads or interconnections for electrical connection. The carrier 31 has a lower surface 311 and an upper surface 312 opposite to the lower surface 311.

Figure 3B:
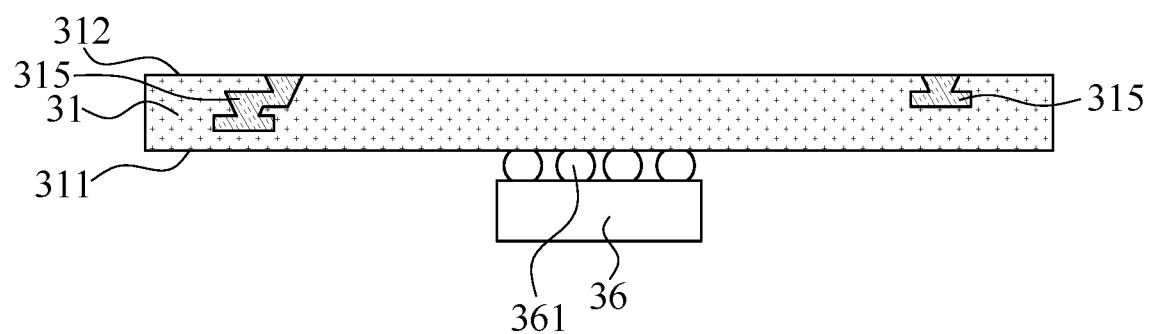

Referring to FIG. 3B, an electronic component 36 is mounted on the lower surface 311 of the carrier 31. The electronic component 36 electrically connects to the carrier 31 via a number of the electrical connections 361.

Figure 3C:
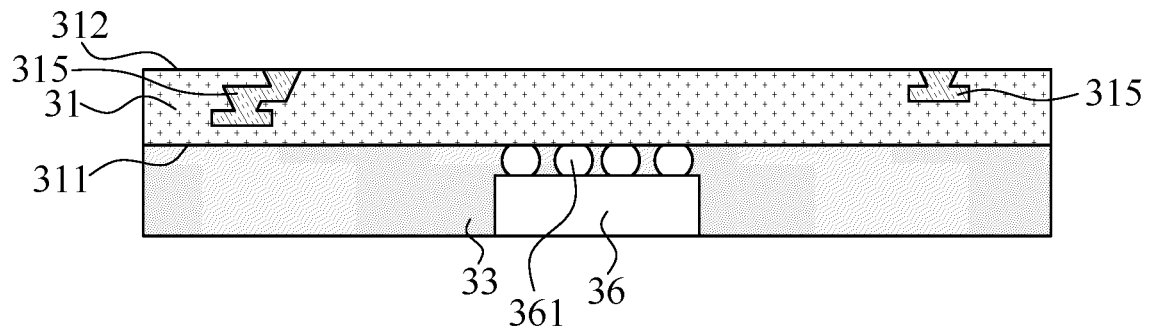

Referring to FIG. 3C, an encapsulant 33 is disposed on the lower surface 311 of the carrier 31 and encapsulates the lower surface 311 of the carrier 31 and the electronic component 36.

Figure 3D:
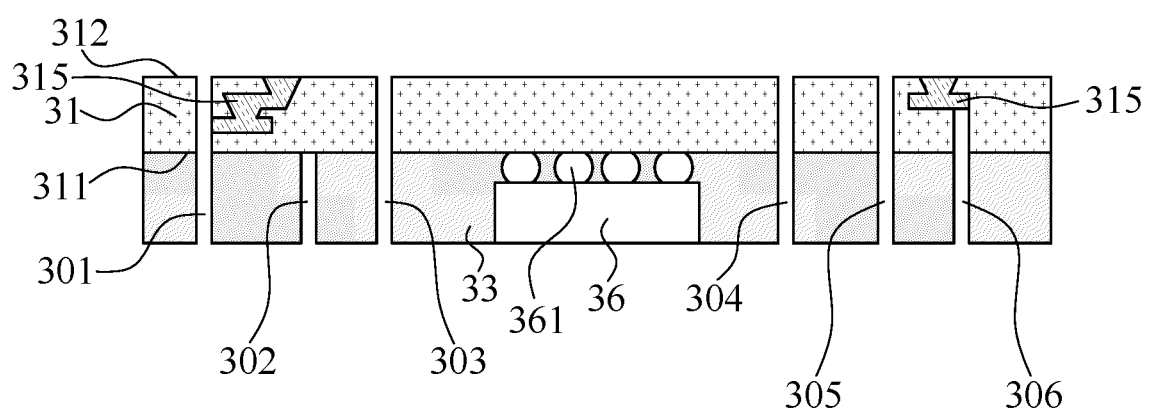

Referring to FIG. 3D, a number of through holes 301, 302, 303, 304, 305 and 306 are formed by mechanical drilling. Since the through holes 301, 302, 303, 304, 305 and 306 are formed by mechanical drilling, the length of the through hole 301, 302, 303, 304, 305, 306 could be controlled on demand. As shown in FIG. 3D, the through holes 301, 303, 304 and 305 are formed to extend throughout the encapsulant 33 and the carrier 31. The through hole 302 are formed to extend throughout the encapsulant 33 only. The through hole 306 are formed to extend throughout the encapsulant 33 and into the carrier 31 but the through hole 306 does not extend throughout the carrier 31.

Figure 3E:
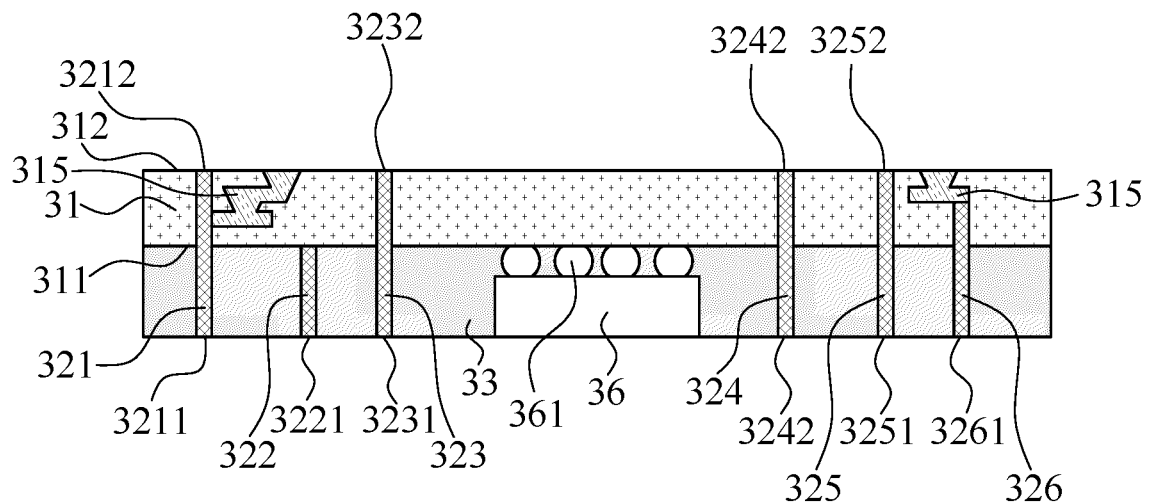

Referring to FIG. 3E, conductive vias 321, 322, 323, 324, 325 and 326 are formed in the through holes 301, 302, 303, 304, 305 and 306 respectively. After the conductive vias 321, 322, 323, 324, 325 and 326 are formed, a grinding process is performed on the lower surface 331 of the encapsulant 33 such that the lower end surfaces 3211, 3221, 3231, 3241, 3251, 3261 of the conductive vias 321, 322, 323, 324, 325, 326 are coplanar with the lower surface 331 of the encapsulant 33. Moreover, as shown in FIG. 3D, the conductive vias 321, 323, 324 and 325 extend throughout the encapsulant 33 and the carrier 31. Thus, the conductive vias 321, 323, 324 and 325 have the upper end surfaces 3212, 3232, 3242 and 3252 exposed from the upper surface 312 of the carrier 31. The conductive via 322 extends throughout the encapsulant 33 only. The conductive via 322 may connect to the interconnection structure 315 of the carrier 31. The conductive via 326 extends throughout the encapsulant 33 and into the carrier 31. Thus, a portion of the conductive via 326 is embedded in the carrier 31. The conductive via 326 may connect to the interconnection structure 315 of the carrier 31.

Figure 3F:
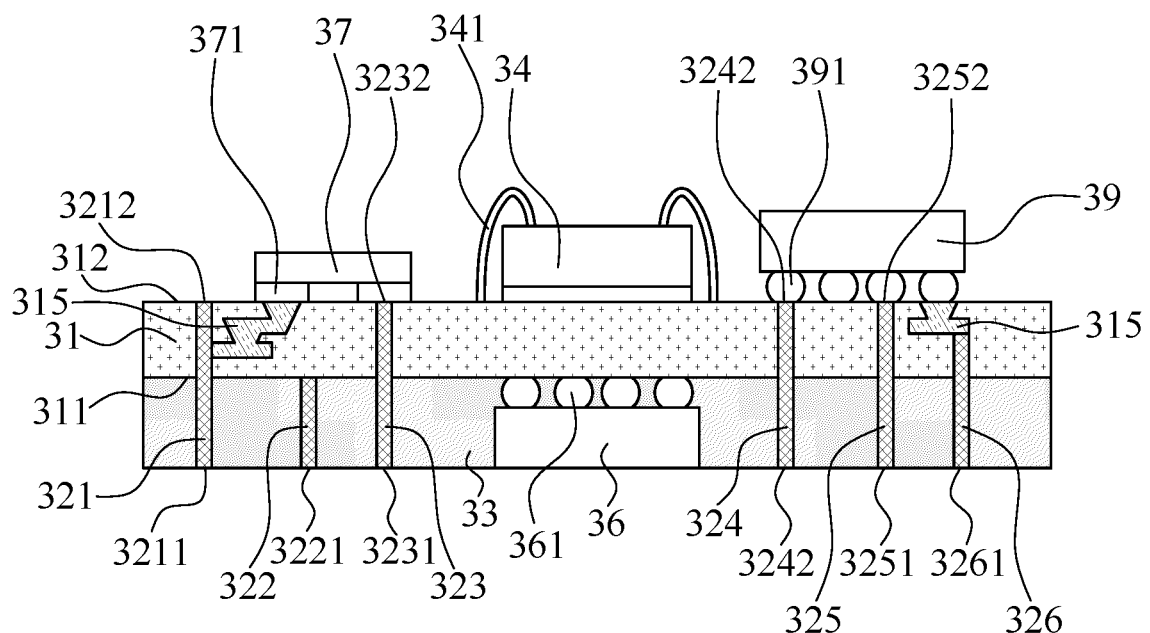

Referring to 3F, electronic components 34, 37 and 39 are mounted on the upper surface 312 of the carrier 31. The electronic component 34 may electrically connect to the carrier 31 via bonding wires 341. The electronic component 37 may electrically connect to the carrier 31 via conductive pads 371. The electronic component 39 may electrically connect to the carrier 31 via electrical connections 391. As shown in FIG. 3F, the upper end surface 3232 of the conductive via 323 contacts the conductive pad 371, and thus the conductive via 323 electrically connect to the electronic component 37. The upper end surfaces 3242, 3252 of the conductive vias 324, 325 directly contact the electrical connections 391, and thus the conductive vias 324 and 325 electrically connect to the electronic component 39. In some embodiments of the present disclosure, the conductive vias 324, 325 may be thermal vias which serves as shorter thermal paths and facilitate the cooling of the electronic component 39. In some embodiments of the present disclosure, the conductive vias 324, 325 may be signal vias which shorten the signal transmission paths and reduce a signal loss. In some embodiments of the present disclosure, the conductive via 321 connects to the interconnection structure 315 of the carrier 31 and the interconnection structure 315 further connects to the conductive pad 371 of the electronic component 37, and thus the conductive via 321 electrically connect to the electronic component 37 via the interconnection structure 315 of the carrier 31. In some embodiments of the present disclosure, the conductive via 326 connects to the interconnection structure 315 of the carrier 31 and the interconnection structure 315 further connects to the electrical connection 391 of the electronic component 39, and thus the conductive via 326 electrically connect to the electronic component 39 via the interconnection structure 315 of the carrier 31. In addition, as shown in FIG. 3F, the conductive vias 322 and 323 are arranged underneath the electronic component 37, and thus the electronic component 37 overlaps the conductive vias 322 and 323 from a top view perspective. The conductive vias 324 and 325 are arranged underneath the electronic component 39, and thus the electronic component 39 overlaps the conductive vias 324 and 325 from a top view perspective.

Figure 3G:
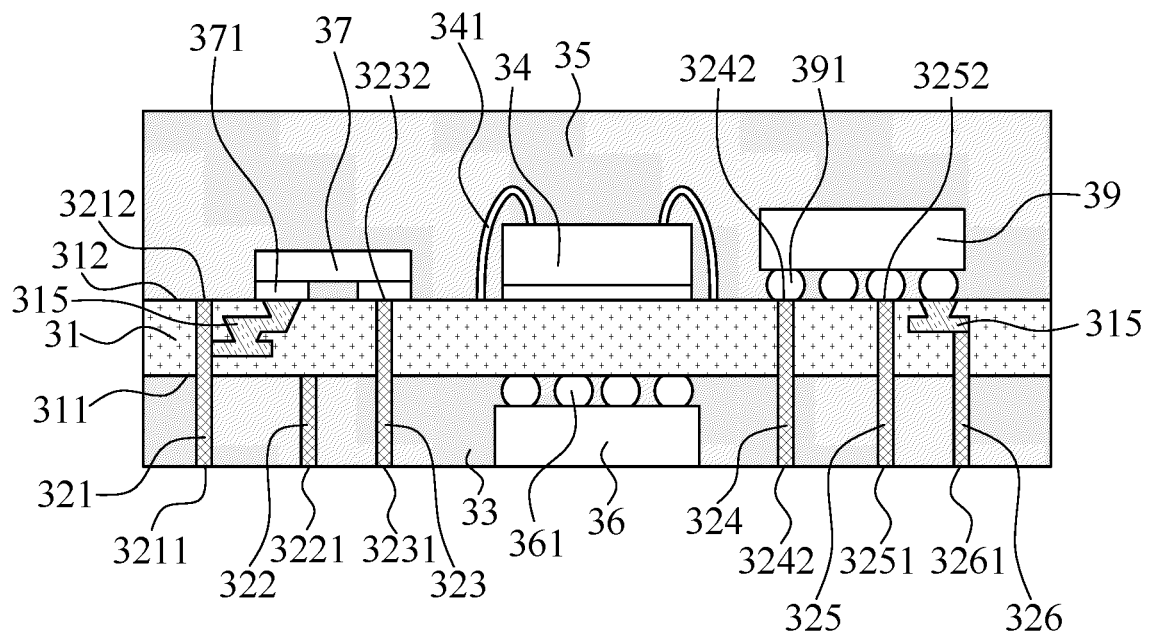

Referring to FIG. 3G, an encapsulant 35 is disposed on the upper surface 312 of the carrier 31 and encapsulates the upper surface 312 of the carrier 31 and the electronic components 34, 37 and 39.

Figure 3H:
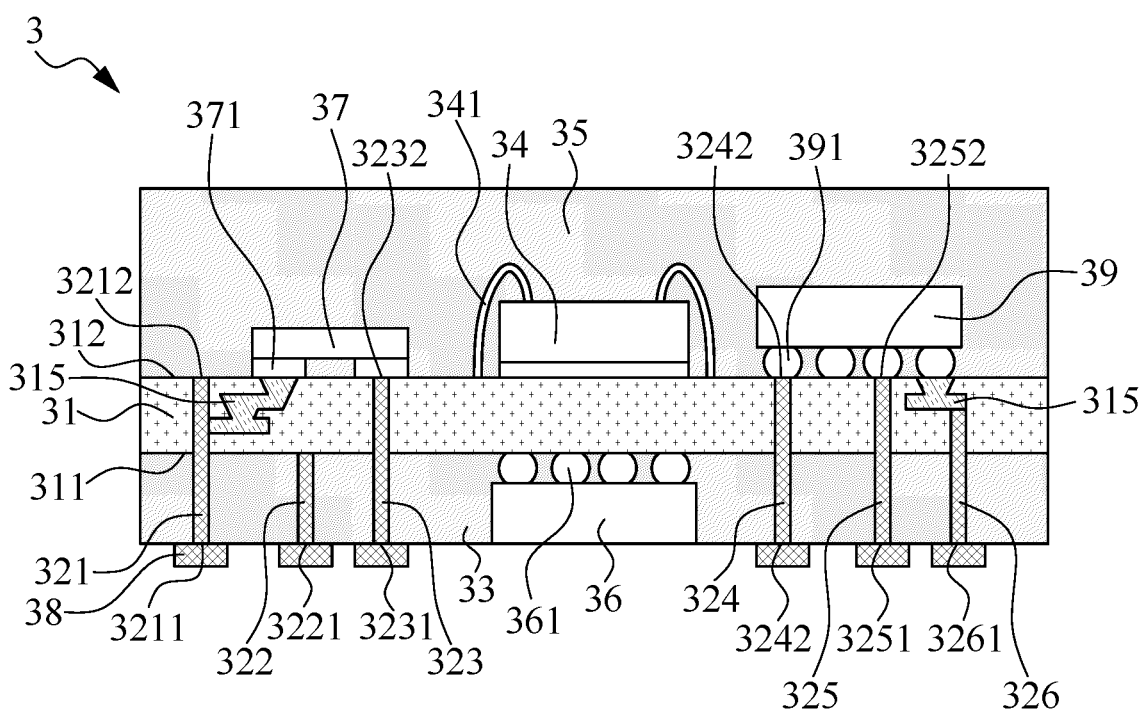

Referring to FIG. 3H, a number of the pads 38 connect to the lower end surface 3211, 3221, 3231, 3241, 3251, 3261 of the conductive vias 321, 322, 323, 324, 325 and 326.

After the manufacturing process as shown in FIG. 3A, FIG. 3B, FIG. 3C, FIG. 3D, FIG. 3E, FIG. 3F, FIG. 3G and FIG. 3H, the semiconductor device package 3 is formed (see FIG. 3H). In some embodiments of the present disclosure, the semiconductor device package 3 is the same as, or similar to, the semiconductor device package 2 shown in FIG. 2A.

FIG. 4A, FIG. 4B, FIG. 4C, FIG. 4D, FIG. 4E, FIG. 4F, FIG. 4G and FIG. 4H illustrate a method for manufacturing a semiconductor device package 4 in accordance with some embodiments of the present disclosure.

Figure 4A:
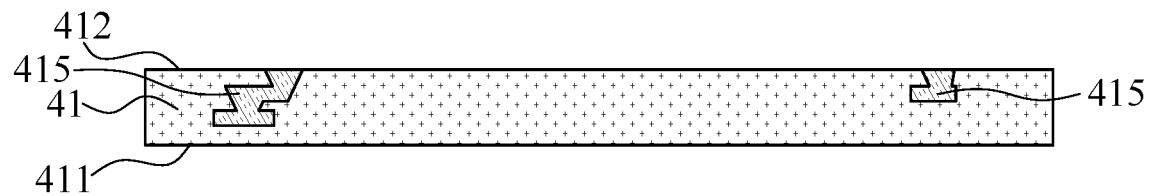
FIG. 4A, FIG. 4B, FIG. 4C, FIG. 4D, FIG. 4E, FIG. 4F, FIG. 4G and FIG. 4H, illustrate a method of manufacturing a semiconductor device package in accordance with another embodiment of the instant disclosure.

Referring to FIG. 4A, a carrier 41 may include a substrates. In some embodiments of the present disclosure, the carrier 41 includes interconnection structures 415, such as traces, pads or interconnections for electrical connection. The carrier 41 has a lower surface 411 and an upper surface 412 opposite to the lower surface 411.

Figure 4B:
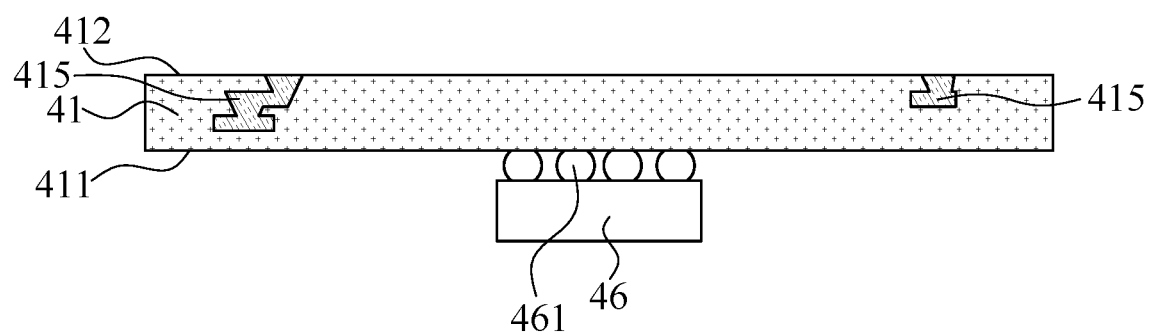

Referring to FIG. 4B, an electronic component 46 is mounted on the lower surface 411 of the carrier 41. The electronic component 46 electrically connects to the carrier 41 via a number of the electrical connections 461.

Figure 4C:
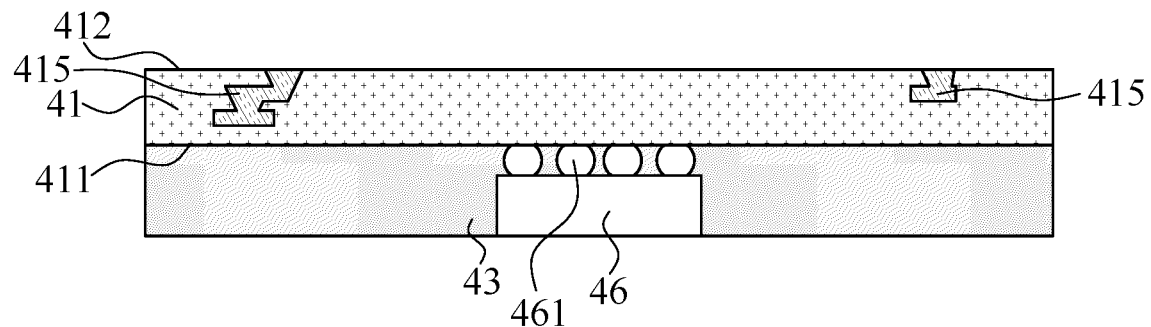

Referring to FIG. 4C, an encapsulant 43 is disposed on the lower surface 411 of the carrier 41 and encapsulates the lower surface 411 of the carrier 41 and the electronic component 46.

Figure 4D:
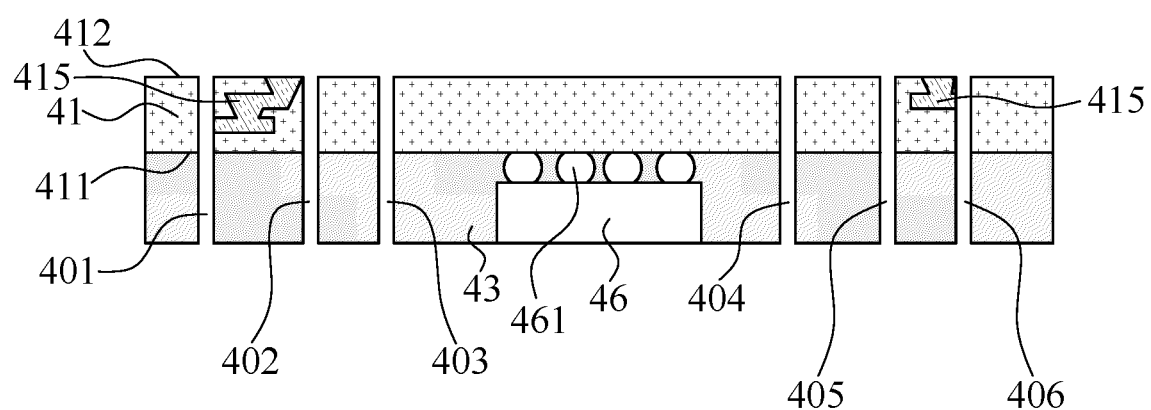

Referring to FIG. 4D, a number of through holes 401, 402, 403, 404, 405 and 406 are formed by mechanical drilling. The through holes 401, 402, 403, 404, 405 and 406 are formed to extend throughout the encapsulant 43 and the carrier 41.

Figure 4E:
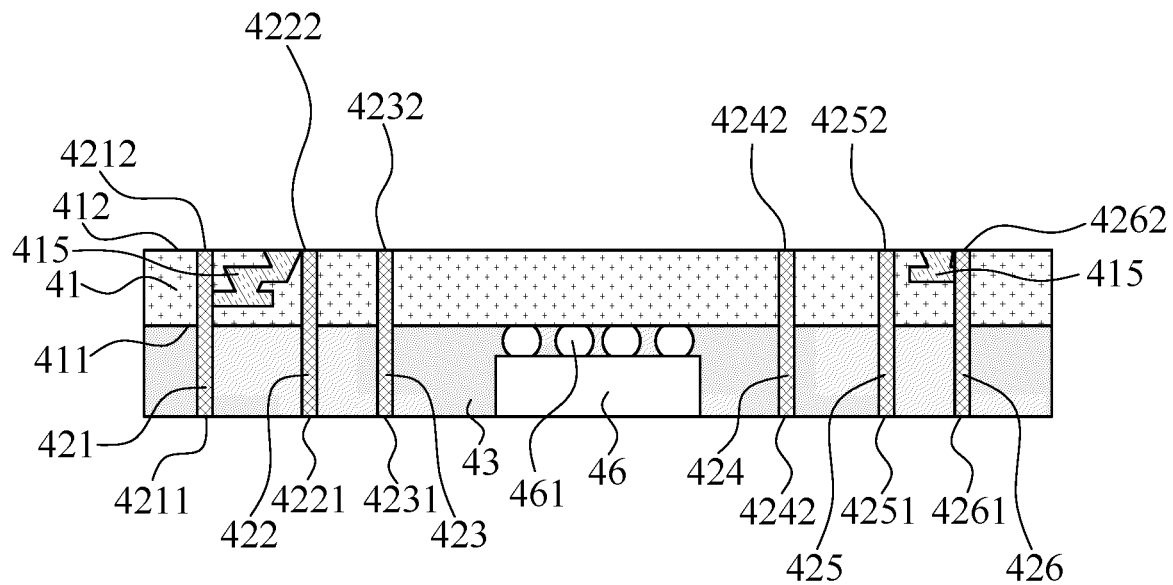

Referring to FIG. 4E, conductive vias 421, 422, 423, 424, 425 and 426 are formed in the through holes 401, 402, 403, 404, 405 and 406 respectively. After the conductive vias 421, 422, 423, 424, 425 and 426 are formed, a grinding process is performed on the lower surface 431 of the encapsulant 43 such that the lower end surfaces 4211, 4221, 4231, 4241, 4251, 4261 of the conductive vias 421, 422, 423, 424, 425, 426 are coplanar with the lower surface 431 of the encapsulant 43. Moreover, as shown in FIG. 3D, the conductive vias 421, 422, 423, 424, 425, 426 extend throughout the encapsulant 33 and the carrier 31. Thus, the conductive vias 421, 422, 423, 424, 425, 426 have the upper end surfaces 4212, 4222, 4232, 4242, 4252, 4262 exposed from the upper surface 412 of the carrier 41.

Figure 4F:
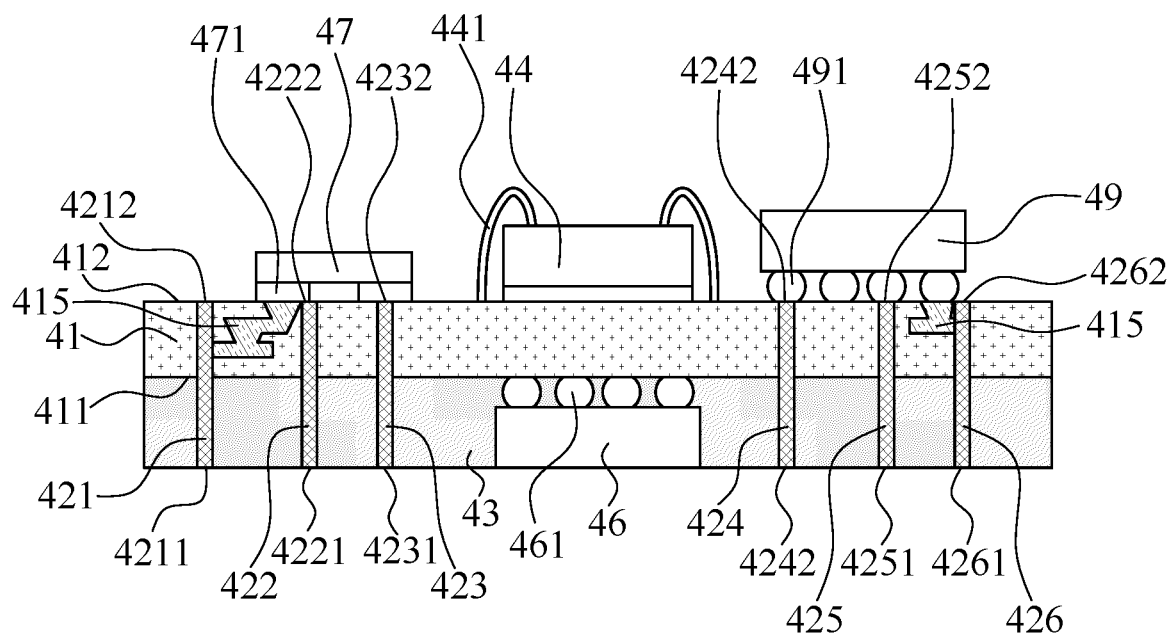

Referring to 4F, electronic components 44, 47 and 49 are mounted on the upper surface 412 of the carrier 41. The electronic component 44 may electrically connect to the carrier 41 via bonding wires 441. The electronic component 47 may electrically connect to the carrier 41 via conductive pads 471. The electronic component 49 may electrically connect to the carrier 41 via electrical connections 491. As shown in FIG. 4F, the upper surface 4222 of the conductive via 422 and the upper end surface 4232 of the conductive via 423 contact the conductive pad 471, and thus the conductive vias 422, 423 electrically connect to the electronic component 47. The upper end surfaces 4242, 4252 of the conductive vias 424, 425 contact the electrical connections 491, and thus the conductive vias 424 and 425 electrically connect to the electronic component 49. In some embodiments of the present disclosure, the conductive via 421 connects to the interconnection structure 415 of the carrier 41 and the interconnection structure 415 further connects to the conductive pad 471 of the electronic component 47, and thus the conductive via 421 electrically connect to the electronic component 47 via the interconnection structure 415 of the carrier 41. In some embodiments of the present disclosure, the conductive via 426 connects to the interconnection structure 415 of the carrier 41 and the interconnection structure 415 further connects to the electrical connection 491 of the electronic component 49, and thus the conductive via 426 electrically connect to the electronic component 49 via the interconnection structure 415 of the carrier 41. In addition, as shown in FIG. 4F, the conductive vias 422 and 423 are arranged underneath the electronic component 47, and thus the electronic component 47 overlaps the conductive vias 422 and 423 from a top view perspective. The conductive vias 424 and 425 are arranged underneath the electronic component 49, and thus the electronic component 49 overlaps the conductive vias 424 and 425 from a top view perspective.

Figure 4G:
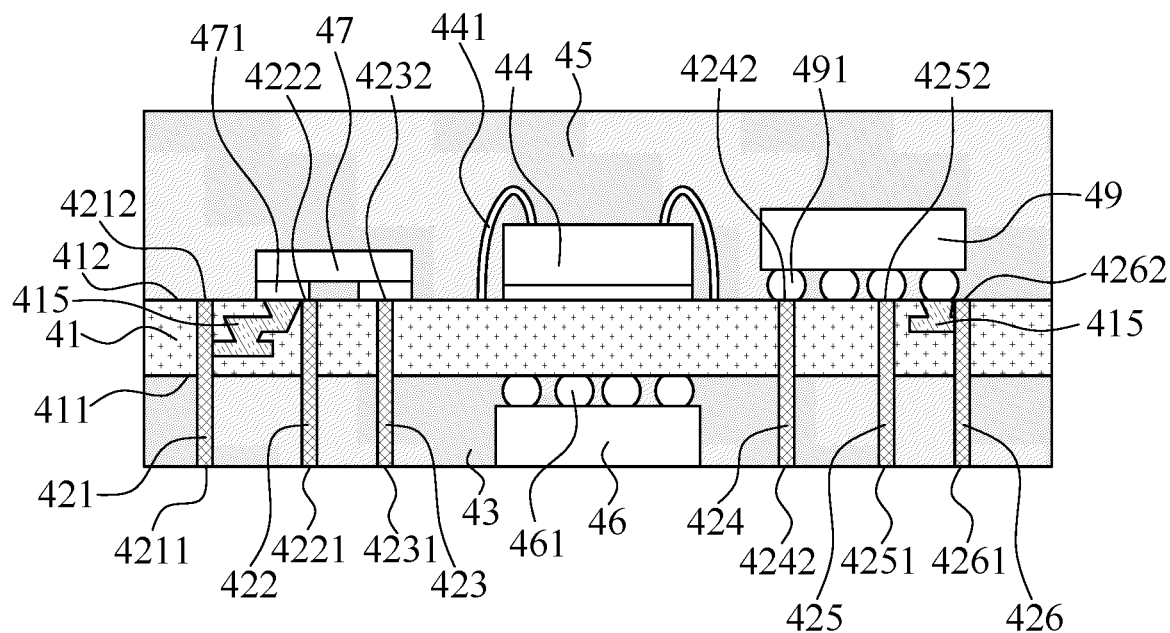

Referring to FIG. 4G, an encapsulant 45 is disposed on the upper surface 412 of the carrier 41 and encapsulates the upper surface 412 of the carrier 41 and the electronic components 44, 47 and 49.

Figure 4H:
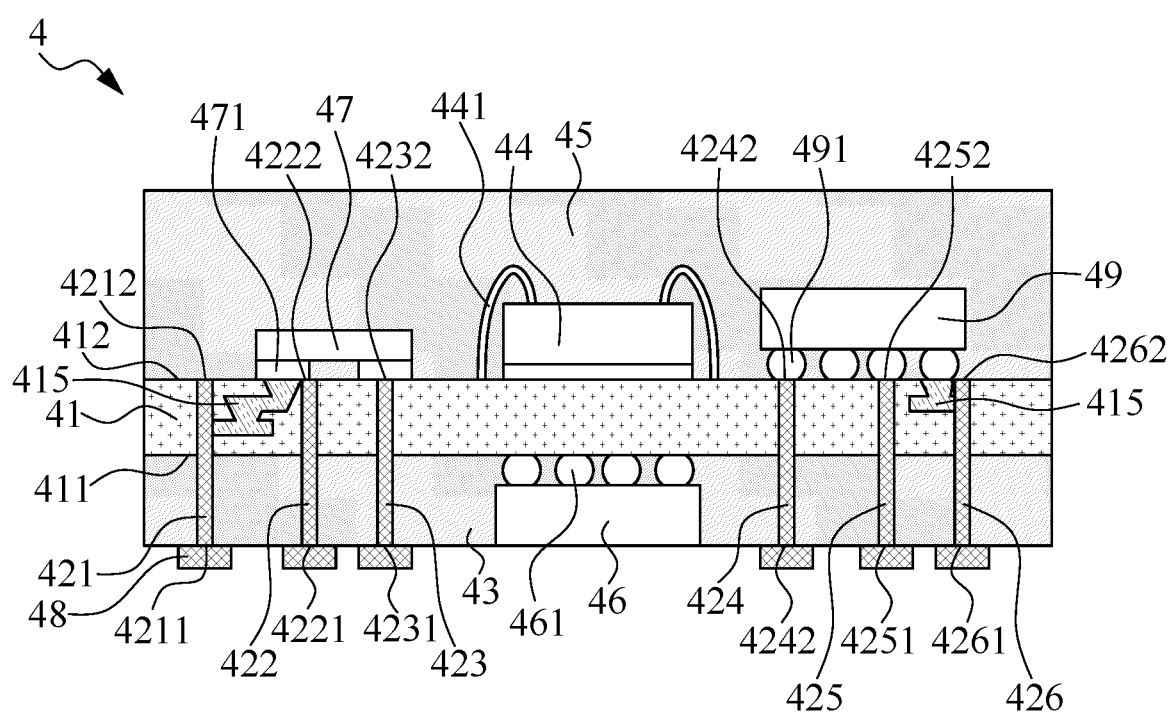

Referring to FIG. 4H, a number of the pads 48 connect to the lower end surface 4211, 4221, 4231, 4241, 4251, 4261 of the conductive vias 421, 422, 423, 424, 425 and 426.

After the manufacturing process as shown in FIG. 4A, FIG. 4B, FIG. 4C, FIG. 4D, FIG. 4E, FIG. 4F, FIG. 4G and FIG. 4H, the semiconductor device package 4 is formed (see FIG. 4H).

Figure 5:
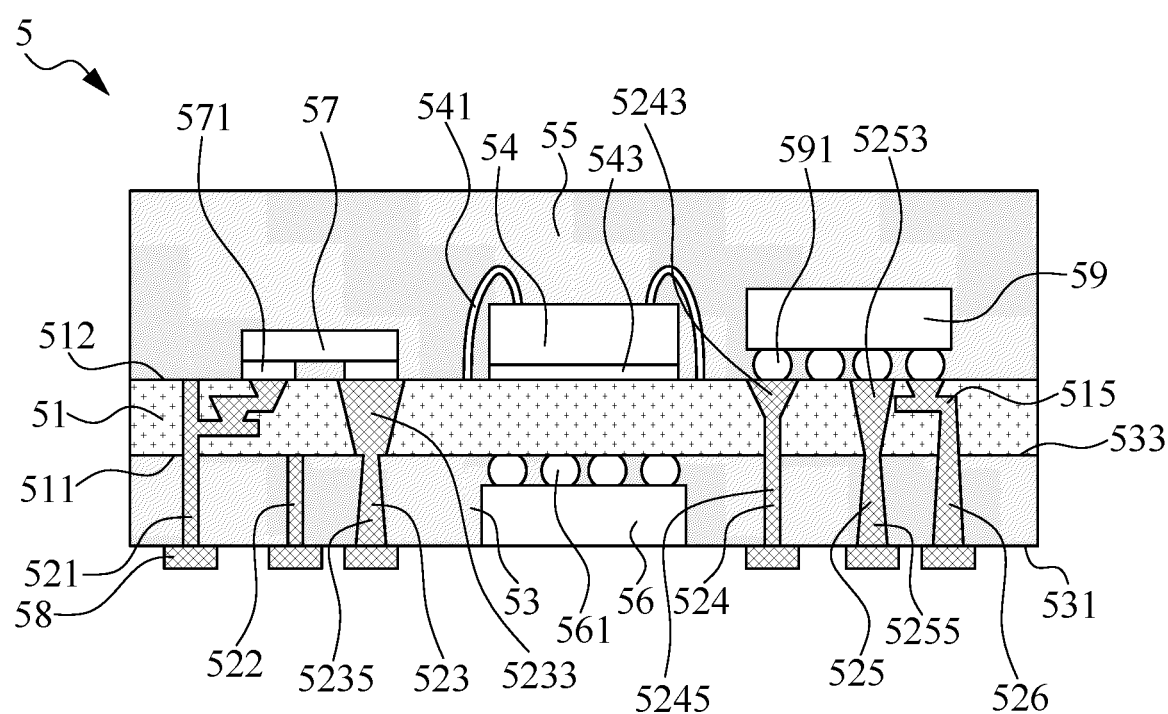
FIG. 5 is a cross-sectional view of a semiconductor device package in accordance with an embodiment of the instant disclosure.

FIG. 5 is a cross-sectional view of a semiconductor device package 5 in accordance with an embodiment of the instant disclosure. As shown in FIG. 5, the semiconductor device package 5 includes a carrier 51, electronic components 54, 56, 57 and 59, encapsulants 53, 55 and conductive vias 521, 522, 523, 524, 525, 526. In some embodiments of the present disclosure, the carrier 51 includes a substrate. In some embodiments of the present disclosure, the carrier 51 includes a fan-out circuit layer. In some embodiments of the present disclosure, the carrier 51 includes interconnection structures 515. The interconnection structure 515 may include traces, pads or interconnections for electrical connection. Referring to FIG. 5, the carrier 51 has a surface 511 (e.g., a lower surface), and the electronic component 56 is disposed or mounted on the surface 511 of the carrier 51. The electronic component 56 may be a die, an active device, a passive device, and/or other electronic devices. In some embodiments of the present disclosure, the electronic component 56 may electrically connected to the carrier 51 via electrical connections 561. The electrical connection 561 may include a solder ball or a solder bump such as a C4 bump. The encapsulant 53 (i.e., package body) covers or encapsulates the surface 511 of carrier 51 and the electronic component 56. The encapsulant 53 may include molding compounds, such as a Novolac-based resin, an epoxy-based resin, a silicone-based resin, or other another suitable encapsulant; fillers such as silicon oxide fillers, may be included in the molding compound. In addition, the encapsulant 53 may include a molding underfill (MUF) or a capillary underfill (CUF). The encapsulant 53 includes a surface 531 facing away from the surface 511 of the carrier 51 and a surface 533 facing the surface 511 of the carrier 51.

Further, referring to FIG. 5, the carrier 51 has a surface 512 (e.g., an upper surface), and the electronic components 54, 57, 59 are disposed or mounted on the surface 512 of the carrier 51. The electronic components 54, 57, 59 may be a die, an active device, a passive device, and/or other electronic devices. In some embodiments of the present disclosure, the electronic component 54 may electrically connected to the carrier 51 via bonding wires 541 and adhesive layer 543. The adhesive layer 543 may include adhesion material, such as DAF. In some embodiments of the present disclosure, the electronic component 57 may electrically connected to the carrier 51 via conductive pads 571. In some embodiments of the present disclosure, the electronic component 59 may electrically connected to the carrier 51 via electrical connections 591. The electrical connection 591, 593 or 595 may include a solder ball or a solder bump such as a C4 bump. The encapsulant 55 (i.e., package body) covers or encapsulates the surface 512 of carrier 51 and the electronic components 54, 57, 59. The encapsulant 55 may include molding compounds, such as a Novolac-based resin, an epoxy-based resin, a silicone-based resin, or other another suitable encapsulant; fillers such as silicon oxide fillers, may be included in the molding compound. In addition, the encapsulant 55 may include a molding underfill (MUF) or a capillary underfill (CUF).

Referring to FIG. 5, the conductive via 523 extends from the surface 531 of the encapsulant 53 to the surface 512 of the carrier 51. That is, the conductive via 523 extends throughout the encapsulant 53 and the carrier 51. In some embodiments of the present disclosure, the conductive via 523 connects to a pad 58. In some embodiments of the present disclosure, the conductive via 523 directly contacts the conductive pad 571, and thus the conductive via 523 electrically connects to the electronic component 57. As shown in FIG. 5, the conductive via 523 is arranged underneath the electronic component 57. Thus, the electronic component 57 overlaps the conductive via 523 from a top view perspective. Further, since the conductive via 523 extends throughout the encapsulant 53 and the carrier 51, the conductive via 523 may include a first portion 5233 extending within the carrier 51 and a second portion 5235 extending within the encapsulant 53. As shown in FIG. 5, a diameter of the first portion 5233 adjacent to the surface 512 of the carrier 511 is greater than a diameter of the first portion 5233 adjacent to the surface 511 of the carrier 511. That is, the first portion 5233 of the conductive via 523 may have a tapered shape which is tapered in a direction from the surface 512 of the carrier 511 to the surface 511 of the carrier 511.

Referring to FIG. 5, the conductive via 524 extends from the surface 531 of the encapsulant 53 to the surface 512 of the carrier 51. That is, the conductive via 524 extends throughout the encapsulant 53 and the carrier 51. In some embodiments of the present disclosure, the conductive via 524 connects to a pad 58. In some embodiments of the present disclosure, the conductive via 524 directly contacts the electrical connection 591, and thus the conductive via 524 electrically connects to the electronic component 59. As shown in FIG. 5, the conductive via 524 is arranged underneath the electronic component 59. Thus, the electronic component 59 overlaps the conductive via 524 from a top view perspective. Further, since the conductive via 524 extends throughout the encapsulant 53 and the carrier 51, the conductive via 524 may include a first portion 5243 extending within the carrier 51 and a second portion 5245 extending within the encapsulant 53. As shown in FIG. 5, a diameter of the first portion 5243 adjacent to the surface 512 of the carrier 511 is greater than a diameter of the first portion 5243 adjacent to the middle portion of the first portion 5243. That is, the first portion 5243 of the conductive via 524 may have a tapered shape which is tapered in a direction from the surface 512 of the carrier 51 to the middle portion of the first portion 5243. In some embodiments of the present disclosure, the diameter of the first portion 5243 adjacent to the middle portion of the first portion 5243 is substantially equal to a diameter of the second portion 5245.

Referring to FIG. 5, the conductive via 525 extends from the surface 531 of the encapsulant 53 to the surface 512 of the carrier 51. That is, the conductive via 525 extends throughout the encapsulant 53 and the carrier 51. In some embodiments of the present disclosure, the conductive via 525 connects to a pad 58. In some embodiments of the present disclosure, the conductive via 525 directly contacts the electrical connection 591, and thus the conductive via 525 electrically connects to the electronic component 59. As shown in FIG. 5, the conductive via 525 is arranged underneath the electronic component 59. Thus, the electronic component 59 overlaps the conductive via 525 from a top view perspective. Further, since the conductive via 525 extends throughout the encapsulant 53 and the carrier 51, the conductive via 525 may include a first portion 5253 extending within the carrier 51 and a second portion 5255 extending within the encapsulant 53. As shown in FIG. 5, a diameter of the first portion 5253 adjacent to the surface 512 of the carrier 51 is greater than a diameter of the first portion 5253 adjacent to the surface 511 of the carrier 51. That is, the first portion 5253 of the conductive via 525 may have a tapered shape which is tapered in a direction from the surface 512 of the carrier 51 to the surface 511 of the carrier 51. Moreover, a diameter of the second portion 5255 adjacent to the surface 531 of the encapsulant 53 is greater than a diameter of the second portion 5255 adjacent to the surface 533 of the encapsulant 53. That is, the second portion 5255 of the conductive via 525 may have a tapered shape which is tapered in a direction from the surface 531 of the encapsulant 53 to the surface 533 of the encapsulant 53. In some embodiments of the present disclosure, the diameter of the first portion 5253 adjacent to the surface 511 of the carrier 51 is substantially equal to the diameter of the second portion 5255 adjacent to the surface 533 of the encapsulant 53.

Referring to FIG. 5, the conductive via 526 extends from the surface 531 of the encapsulant 53 and extends into the carrier 51. Thus, the conductive via 526 extends throughout the encapsulant 53 and a portion of the conductive via 526 embedded in the carrier 51. In some embodiments of the present disclosure, the conductive via 526 connects to a pad 58. As shown in FIG. 5, the portion of the conductive via 526 extending into the carrier 51 connects to the interconnection structure 515 of the carrier 51 and the interconnection structure 515 further connects to the electrical connection 595, and thus the conductive via 526 electrically connects to the electronic component 59 via the interconnection structure 515. Referring to FIG. 5, a diameter of the conductive via 526 adjacent to the surface 531 of the encapsulant 53 is greater than a diameter of the portion of the conductive via 526 in the carrier 51. That is, the conductive via 526 may have a tapered shape which is tapered in a direction from the surface 531 of the encapsulant 53 to the carrier 51.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
    a carrier having a first surface and a second surface opposite to the first surface;
    a first electronic component disposed on the second surface of the carrier;
    a first encapsulant encapsulating the first surface of the carrier and having a first surface facing away from the first surface of the carrier and a second surface facing the first surface of the carrier; and
    a conductive via extending from the first surface of the first encapsulant into the carrier, wherein the conductive via comprises a first portion within the carrier and a second portion within the first encapsulant;
    wherein the first portion of the conductive via has a first diameter adjacent to the first surface of the carrier and the second portion of the conductive via has a second diameter adjacent to the second surface of the first encapsulant, and wherein the first diameter is substantially equal to the second diameter;
    wherein the conductive via comprises a first thermal via overlapping with the first electronic component from a bottom view perspective, and wherein a second thermal via extending from the first surface of the first encapsulant to the carrier and free from overlapping with the first electronic component from the bottom view perspective.

2. The semiconductor device package of claim 1, wherein a diameter of the first portion of the conductive via is equal to a diameter of the second portion of the conductive via.

3. The semiconductor device package of claim 1, wherein the conductive via electrically connects to the first electronic component.

4. The semiconductor device package of claim 1, wherein the conductive via extends through the carrier.

5. The semiconductor device package of claim 4, wherein the conductive via contacts a bonding wire and is configured to electrically connect to the first electronic component.

6. The semiconductor device package of claim 4, wherein the conductive via contacts an adhesive layer and is configured to electrically connect to the first electronic component.

7. The semiconductor device package of claim 4, wherein the conductive via contacts an electrical connection configured to electrically connect to the first electronic component.

8. The semiconductor device package of claim 4, wherein the first electronic component comprises a number of the electrical connections and wherein at least one of the electrical connections contacts the conductive via.

9. The semiconductor device package of claim 1, wherein the conductive via connects to an interconnection structure of the carrier.

10. The semiconductor device package of claim 1, wherein the first electronic component overlaps the conductive via from a top view perspective.

11. The semiconductor device package of claim 1, wherein the carrier comprises a fan-out circuit layer.

12. The semiconductor device package of claim 1, further comprising a second encapsulant encapsulating the second surface of the carrier and the first electronic component.

13. A semiconductor device package, comprising:
- a carrier having a first surface and a second surface opposite to the first surface;
- an electronic component disposed on the second surface of the carrier;
- a first encapsulant encapsulating the first surface of the carrier and having a surface facing away from the first surface of the carrier; and
- a conductive via extending from the surface of the first encapsulant into the carrier;

wherein the conductive via has a plurality of conductive particles and at least one of the conductive particle crosses a boundary plane between the first encapsulant and the carrier.

14. The semiconductor device package of claim 13, wherein the conductive via is formed by a mechanical process.

15. The semiconductor device package of claim 13, wherein the conductive via extends to the second surface of the carrier.

16. The semiconductor device package of claim 13, wherein the conductive via extends through the carrier.

17. The semiconductor device package of claim 16, wherein the conductive via contacts an electrical connection and is configured to electrically connect to the electronic component.

18. The semiconductor device package of claim 1, further comprising a second electronic component disposed on the first surface of the carrier and covered by the first encapsulant, wherein the second electronic component has a portion exposed from the first encapsulant.

19. The semiconductor device package of claim 9, further comprising a shielding layer covering a side surface of the carrier and a side surface of the first encapsulant and electrically connecting the conductive via through the interconnection structure.

* * * * *